United States Patent
Lee et al.

(10) Patent No.: US 7,405,716 B2
(45) Date of Patent: *Jul. 29, 2008

(54) LIQUID CRYSTAL DISPLAY DEVICE

(75) Inventors: Back-Won Lee, Seoul (KR); Seung-Hwan Moon, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/366,324

(22) Filed: Mar. 2, 2006

(65) Prior Publication Data
US 2006/0161693 A1    Jul. 20, 2006

Related U.S. Application Data

(63) Continuation of application No. 10/407,288, filed on Apr. 4, 2003, now Pat. No. 7,023,410.

(30) Foreign Application Priority Data

| | | | |
|---|---|---|---|
| Apr. 8, 2002 | (KR) | ............................... | 2002-18924 |
| Oct. 9, 2002 | (KR) | ............................... | 2002-61454 |
| Dec. 30, 2002 | (KR) | ............................... | 2002-87014 |

(51) Int. Cl.
*G09G 3/34* (2006.01)

(52) U.S. Cl. ........................................ 345/87; 345/204

(58) Field of Classification Search ........... 345/87–102, 345/204
See application file for complete search history.

(56) References Cited

U.S. PATENT DOCUMENTS 5,136,622 A       8/1992  Plus
7,023,410 B2 *   4/2006  Lee et al. ...................... 345/87

FOREIGN PATENT DOCUMENTS

CN           1326178 A       12/2001

\* cited by examiner

*Primary Examiner*—Nitin Patel
(74) *Attorney, Agent, or Firm*—F. Chau & Associates, LLC

(57) ABSTRACT

A driver circuit drives display device and LCD device has a driver circuit that includes driving stages and dummy stage. The driving stage includes output and control terminals. The output terminal of the present stage is connected to the control terminal of the previous state to be cascade-connected each other. The driving stage outputs driving signal for controlling the switching device arranged on the display device through the output terminal. The dummy stage includes dummy output terminal and dummy control terminal. The dummy output terminal is connected to the control terminal of the last driving stage to output dummy output signal for turning on or off the last driving stage. The dummy control terminal is connected to the dummy output terminal to be turned on or off by the dummy output signal. The delay of signals is reduced, thereby enhancing display quality.

9 Claims, 15 Drawing Sheets

LIQUID CRYSTAL DISPLAY DEVICE

CROSS-REFERENCE TO RELATED APPLICATIONS

This application is a continuation of application Ser. No. 10/407,288 filed Apr. 4, 2003, now U.S. Pat. No. 7,023,410, which claims priority to Korean Patent Applications No. 2002-18924, P2002-61454 and P2002-87014 filed on Apr. 8, 2002, Oct. 9, 2002 and Dec. 30, 2002, respectively, the contents of which are herein incorporated by reference in their entirety.

BACKGROUND OF THE INVENTION

1. Field of the Invention

The disclosure relates to a driver circuit for driving an active matrix driving display device and an active matrix driving display device having the driver circuit, and more particularly to a driver circuit that enhances the display quality of a display device and a liquid crystal display device having the driver circuit.

2. Description of the Related Art

Generally, a polycrystalline liquid crystal display (LCD) device has a high operation speed and consumes low power, but many processes of manufacturing the polycrystalline LCD device are required. The polycrystalline LCD device is used usually in display devices having a small screen size. An amorphous LCD device is used usually in display devices having a large screen size, for example, lap top computers (or notebook computers), LCD monitors, high definition televisions (HDTV's).

Recently, the amorphous LCD device employs a gate driver circuit formed on a glass substrate (or thin film transistor substrate) of an LCD panel so as to reduce the steps of manufacturing the LCD device.

Generally, the gate driver circuit includes a shift register and wiring part. The wiring part provides the shift register with a plurality of signals. The wiring part includes a plurality of wirings, and the layout of the wirings affects the output signals outputted from the gate driver circuit. The output signals from the gate driver circuit may be distorted due to the capacitance induced by the wirings crossing each other. Accordingly, the display quality of the LCD device is lowered.

The conventional gate driver circuit formed on the thin film transistor (TFT) substrate has the following problems when the gate driver circuit is employed in the amorphous LCD device having a large screen size and high resolution.

According as the screen size of the LCD device becomes larger and the resolution of the LCD device becomes higher, the number of the gate lines and the pixels formed on the TFT substrate increases. According as the number of the gate lines and the pixels increases, the father the gate line are spaced apart from the gate driver, the larger is the RC delay of the gate line. The high level period of a clock signal on the last gate line is delayed large enough to cause the distortion of the output signal compared with the high level period of a clock signal on the first gate line. Therefore the display quality is deteriorated.

In addition, a capacitance is generated between the wirings disposed the farthest from the driver circuit and having a large line width. Accordingly, the RC delay of the wirings increases. Therefore, there is required a wiring structure in which the delay of the gate driving signal transmitted to the gate line is minimized.

SUMMARY OF THE INVENTION

Accordingly, the present invention is provided to substantially obviate one or more problems due to limitations and disadvantages of the related art.

It is first feature of the present invention to provide a driver circuit for driving an active matrix driving display device for the purpose of enhancing the display quality of the display device.

It is a second feature of the present invention to provide a display device having the driver circuit.

It is a third feature of the present invention to provide a display device having the wiring structure that provides enhanced display quality of the display device.

In one aspect of the present invention, there is provided a driver circuit for driving an active matrix driving display device. The driver circuit includes a plurality of driving stages and a dummy stage. Each of the driving stages includes an output terminal and a control terminal. The output terminal of a present driving stage is coupled to the control terminal of a previous state to be cascade-connected each other, each of the driving stages outputs a driving signal for controlling a switching device through the output terminal. The switching device is arranged on the active matrix driving display device. The dummy stage includes a dummy output terminal and a dummy control terminal. The dummy output terminal is coupled to the control terminal of a last driving stage among the driving stages to output a dummy output signal for turning on or turning off the last driving stage. The dummy control terminal is coupled to the dummy output terminal to be turned on or turned off by the dummy output signal.

In another aspect of the present invention, there is provided a liquid crystal display device comprising a display part and a gate driver. The display part includes a first substrate, a second substrate facing the first substrate and a liquid crystal layer interposed between the first and second substrates. The first substrate has a plurality of gate lines connected to a switching device formed on a pixel, and the pixel is arranged in a matrix shape. The gate driver drives the switching device, and the gate driver includes a plurality of driving stages and a dummy stage. Each of the driving stages has an output terminal and a control terminal. The output terminal of a present driving stage is coupled to the control terminal of a previous state to be cascade-connected each other. Each of the driving stages outputs a driving signal for controlling the switching device through the output terminal to each of the gate lines. The dummy stage includes a dummy output terminal and a dummy control terminal. The dummy output terminal is coupled to the control terminal of a last driving stage among the driving stages to output a dummy output signal for turning on or turning off the last driving stage. The dummy control terminal is coupled to the dummy output terminal to be turned on or turned off by the dummy output signal.

In still another aspect of the present invention, there is provided a liquid crystal display device comprising a display part, a data driver and a gate driver. The display part includes i) a first substrate having a pixel, a gate line and a data line, the pixel having a switching device connected to the gate line and the data line, ii) a second substrate facing the first substrate, and iii) a liquid crystal layer interposed between the first and second substrates. The data driver provides the data line with an image data, and the data driver is formed adjacent to the display part and is coupled to the data line. The gate driver drives the switching device. The gate driver includes a shift register and a wiring part. The shift register has a plurality of stages cascade-connected each other. The shift register is divided into a first group and a second group and being formed adjacent to the display part. External signals are applied to each of the stages through the wiring part, and each of the driving stages outputs a driving signal for controlling the switching device through an output terminal to the gate line. The wiring part comprises a first clock line, a second clock line, a third clock line and a fourth clock line. A first clock signal is supplied to odd-numbered stages of the first group through the first clock line. A second clock signal having a 180° different phase with respect to the first clock signal is supplied to even-numbered driving stages of the first group through the second clock line. The first clock signal is supplied to the odd-numbered driving stages of the second group through the third clock line. The second clock signal is supplied to the even-numbered driving stages of the second group through the fourth clock line.

According to the present invention, the dummy output terminal of the dummy stage is connected the control terminal of the last driving stage and also connected to the dummy control terminal of the dummy stage. In addition, the wiring part further includes third and fourth clock lines through which the first and second clock CK and CKB are applied in addition to the first and second clock lines. The LCD device may provide enhanced display quality.

BRIEF DESCRIPTION OF THE DRAWINGS

The above and other features and advantages of the present invention will become more apparent by describing in detail the preferred embodiments thereof with reference to the accompanying drawings, in which.

DESCRIPTION OF THE PREFERRED EMBODIMENTS

Hereinafter the preferred embodiments of the present invention will be described in detail with reference to the accompanying drawings.

Figure 1:
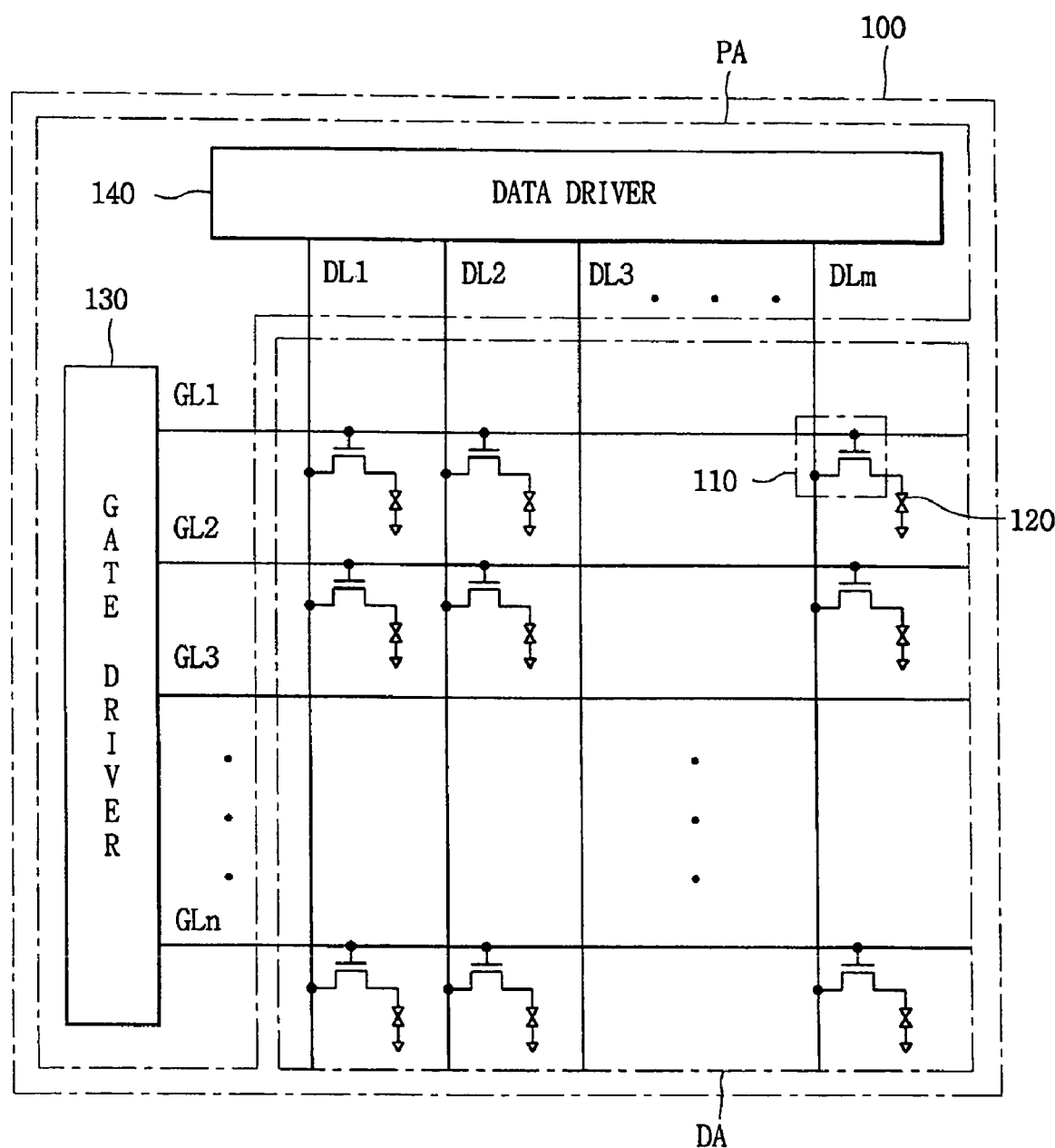
FIG. 1 is a schematic view showing a liquid crystal display panel according to a first exemplary embodiment of the present invention.
Figure 2:
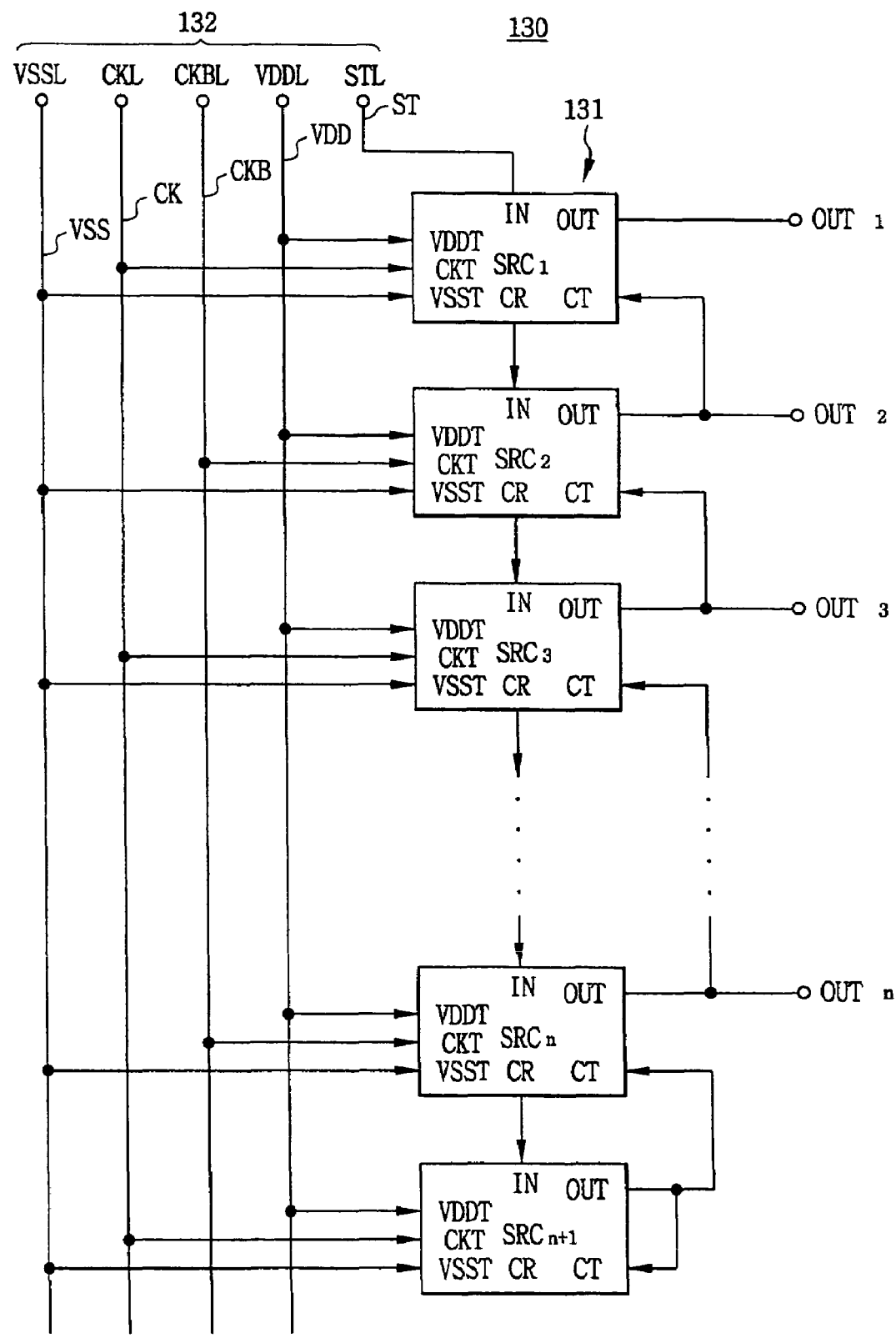
FIG. 2 is a block diagram showing the shift register of the driving the gate driver circuit of FIG. 1.

FIG. 1 is a schematic view showing a liquid crystal display panel according to a first exemplary embodiment of the present invention, and FIG. 2 is a block diagram showing the shift register of the driving the gate driver circuit of FIG. 1.

Referring to FIG. 1, the liquid crystal display panel according to the first exemplary embodiment of the present invention includes a TFT substrate 100, a color filter substrate (not shown) and a liquid crystal layer (not shown) interposed between the TFT substrate 100 and the color filter substrate.

The TFT substrate 100 has a display area (DA) and a peripheral area (PA). A plurality of pixels is arranged in a matrix shape in the display area. Each of the pixels includes a thin film transistor (TFT) 110 and a pixel electrode 120 connected to the TFT 110. The TFT 110 is connected with a data line (DL) and a gate line (GL). The data line is extended in a first direction, and the gate line is extended in a second direction substantially perpendicular to the first direction.

The resolution of the liquid crystal display panel 200 depends on the number of the pixels. When the number of the pixels are m*n, the resolution is m*n, and the TFT substrate 100 has m data lines (DL1, DL2, . . . , DLm) and n gate lines (GL1, GL2, . . . , GLn).

A data driver circuit 140 is disposed in the first peripheral region (PA) in which one ends of the data lines (DL1, DL2, . . . , DLm) are disposed. A gate driver circuit 130 is disposed in the second peripheral region (PA) in which one ends of the gate lines (GL1, GL2, . . . , GLn) are disposed. The gate driver circuit may be formed through the same process as the process in which the pixels are formed in the display area (DA). The gate driver circuit 130 includes a shift register.

As shown in FIG. 2, the shift register 131 includes a plurality of stages (SRC1, . . . , SRCn+1) that are cascade-connected each other. In detail, the shift register 131 includes n (even number) driving stages (SRC1, . . . , SRCn) and a dummy stage (SRCn+1).

The n driving stages (SRC1, . . . , SRCn) output gate driving signal sequentially to the n gate lines (GL1, . . . , GLn). Each of the output terminals of the n driving stage (SRC1, . . . , SRCn) is connected to the control terminal (CT) of the previous driving stage. Each of the carry terminals (CR) of the n driving stage (SRC1, . . . , SRCn) is connected to the input terminal (IN) of the next driving stage. A start signal (ST) instead of the output signal is applied to the input terminal (IN) of the first driving stage (SRC1).

The input terminal (IN) of the dummy stage (SRCn+1) is connected to the carry terminal (CR) of the nth driving stage (SRCn). The output terminal (OUT) of the dummy stage (SRCn+1) is connected to the control terminal (CT) of the nth driving stage (SRCn), so that the dummy stage (SRCn+1) controls the nth driving stage (SRCn). The output terminal (OUT) of the dummy stage (SRCn+1) is also connected to the control terminal (CT) of the dummy stage (SRCn+1). Accordingly, the dummy stage (SRCn+1) is controlled by the output signal outputted from the dummy stage (SRCn+1).

A wring part 132 is disposed adjacent to the shift register 131. The wring part 132 provides the shift register 131 with a plurality of signals. In detail, the wiring part 132 includes a start signal line (STL), a first power line (VDDL), a first clock line (CKL), a second clock line (CKBL) and a second power line (VSSL).

The start signal (ST) is supplied to the input terminal (IN) of the first driving stage (SRC1) through the start signal line (STL). The start signal (ST) is a pulse signal synchronized with a vertical synchronization signal (Vsync) outputted from an external graphic controller (not shown). The first power line (VDDL) is connected to the n driving stages (SRC1, ..., SRCn) and the dummy stage (SRCn+1), and a first power voltage signal (VDD) is applied to the n driving stages (SRC1, ..., SRCn) and the dummy stage (SRCn+1) through the first power line (VDDL). The second power line (VSSL) is connected to the n driving stages (SRC1, ..., SRCn) and the dummy stage (SRCn+1), and a second power voltage signal (VSS) is applied to the n driving stages (SRC1, ..., SRCn) and the dummy stage (SRCn+1) through the second power line (VSSL).

A first clock signal (CK) is applied to the odd number of driving stages (SRC1, SRC3, ...) and the dummy stage (SRCn+1) through the first clock line (CKL). A second clock signal (CKB) having a 180° different phase with respect to the first clock signal (CK) is applied to the even number of driving stages (SRC2, ..., SRCn) through the second clock line (CKBL).

Accordingly, since the output signals (OUT1, ..., OUTn) having an active period (high level period) are generated sequentially, the each of the gate lines (GL1, ..., GLn) corresponding to each of the output signals (OUT1, ..., OUTn) is sequentially selected during the active period of the output signals (OUT1, ..., OUTn).

Figure 3:
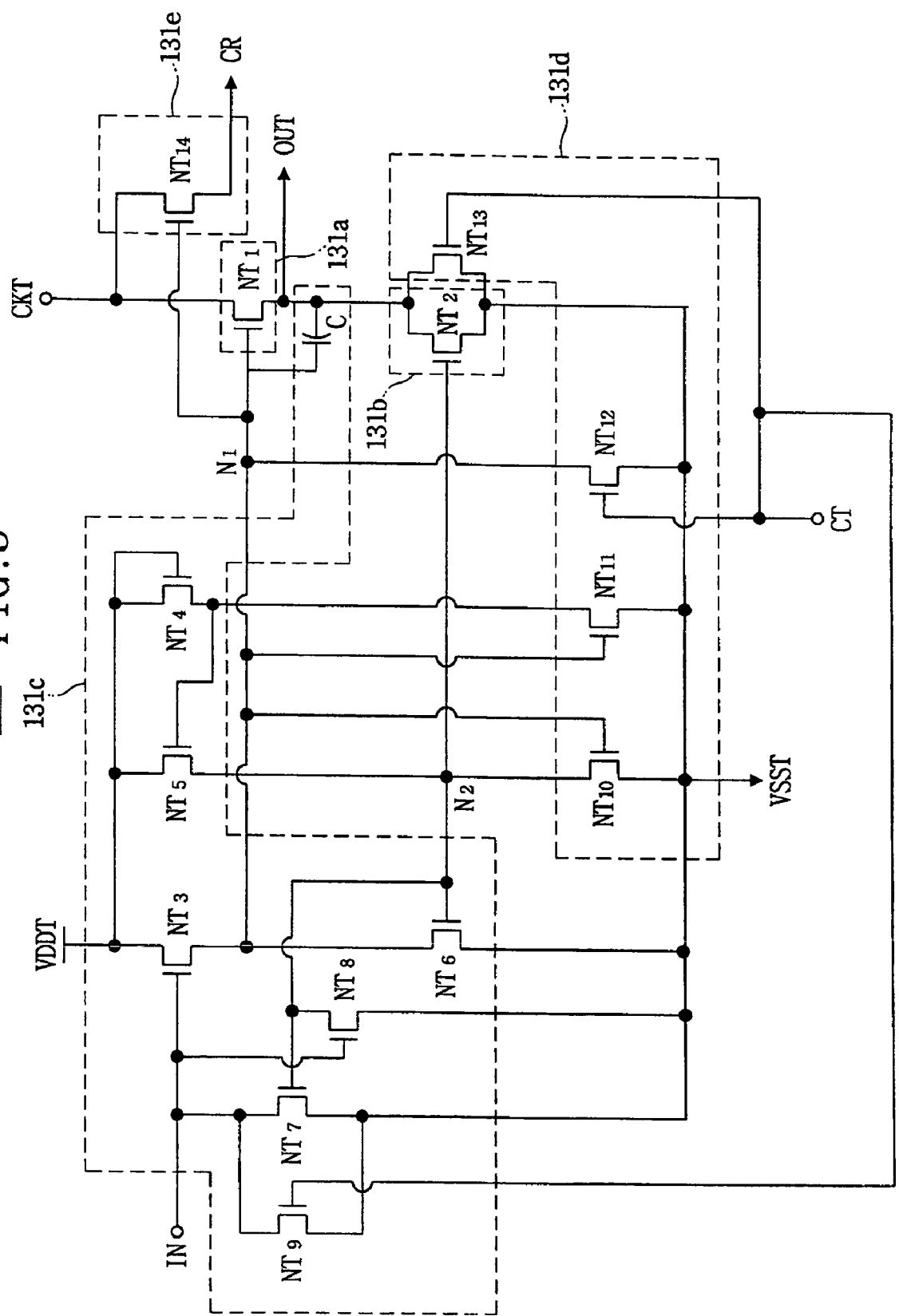
FIG. 3 is a circuit diagram showing the driving stage of FIG. 2.
Figure 4:
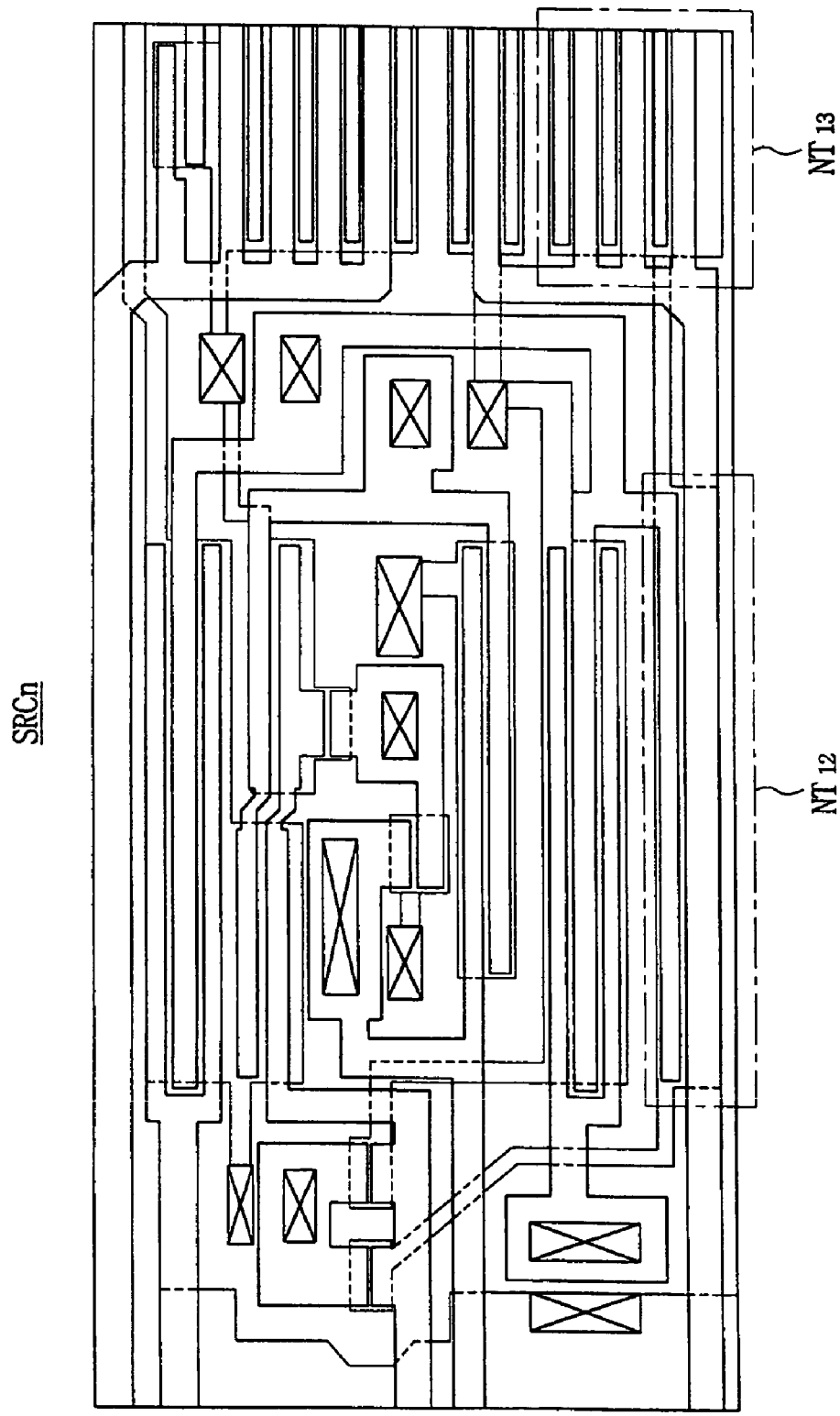
FIG. 4 is a plan view showing the layout of the driving stage of FIG. 3.

FIG. 3 is a circuit diagram showing the driving stage of FIG. 2, and FIG. 4 is a plan view showing the layout of the driving stage of FIG. 3. The nth driving stage (SRCn) is shown in FIGS. 3 and 4, and the other driving stages (SRC1, ..., SRCn−1) have the same circuit as the nth driving stage (SRCn).

Referring to FIGS. 3 and 4, the nth driving stage (SRCn) of the shift register 131 includes a pull-up part 131a, a pull-down part 131b, a pull-up driver part 131c, a pull-down driver part 131d and a carry output part 131e. The nth driving stage (SRCn) has an input terminal (IN), an output terminal (OUT), a control terminal (CT), a clock terminal (CKT), a second power line terminal (VSST), a first power line terminal (VDDT) and a carry output terminal (CR).

The pull-up part 131a includes a first NMOS transistor (NT1). The clock signal (CK) is applied to the drain of the first NMOS transistor (NT1), a gate of the first NMOS transistor (NT1) is connected to a first node (N1), and a source of the first NMOS transistor (NT1) is connected to the output terminal (OUT).

The pull-down part 131b includes a second NMOS transistor (NT2). A drain of the second NMOS transistor (NT2) is connected to the output terminal (OUT), a gate of the second NMOS transistor (NT2) is connected to a second node (N2), and a source of the second NMOS transistor (NT2) is connected to the second power line terminal (VSST).

The pull-up driver part 131c includes a capacitor (C), NMOS transistors (NT3, NT4, NT5, NT6, NT7, NT8 and NT9). The capacitor is connected between the first input node (N1) and the output terminal (OUT). The drain of a third transistor (NT3) is connected to the first power line terminal (VDDT), the gate of the third transistor (NT3) is connected to the input terminal (IN), and the source of the third transistor (NT3) is connected to the first input node (N1). The drain and gate of the fourth transistor (NT4) is commonly connected to the first power line terminal (VDDT), and the source of the fourth transistor (NT4) is connected to the gate of a fifth transistor (NT5). The drain of the fifth transistor (NT5) is connected to the first power line terminal (VDDT), a gate of the fifth transistor (NT5) is connected to the source of the fourth transistor (NT4), and the source of the fifth transistor (NT5) is connected to the second node (N2).

The drain of the sixth transistor (NT6) is connected to the source of the third transistor (NT3), the gate of the sixth transistor (NT6) is connected to the second node (N2), and the source of the sixth transistor (NT6) is connected to the second power line terminal (VSST). The drain of the seventh transistor (NT7) is connected to the input terminal (IN), the gate of the seventh transistor (NT7) is connected to the second node (N2), and the source of the seventh transistor (NT7) is connected to the second power line terminal (VSST). The drain of the eighth transistor (NT8) is connected to the second node (N2), the gate of the eighth transistor (NT8) is connected to the input terminal (IN), and the source of the eighth transistor (NT8) is connected to the second power line terminal (VSST).

Although not shown in FIG. 3, the source of the eighth transistor (NT8) may be connected to a third power line terminal through which a third power voltage signal having a voltage level lower than the second power voltage signal (VSS) is supplied. The drain of the ninth transistor (NT9) is connected to the input terminal (IN), the gate of the ninth transistor (NT9) is connected to the control terminal (CT), and the source of the ninth transistor (NT9) is connected to the second power line (VSST).

The pull-down driver part includes NMOS transistors (NT10, NT11, NT12 and NT13). In detail, the drain of a tenth transistor (NT10) is connected to the second node (N2), the gate of the tenth transistor (NT10) is connected to first node (N1), and the source of the tenth transistor (NT10) is connected to the second power line terminal (VSST). The drain of the eleventh transistor (NT11) is connected to the source of the fourth transistor (NT4), the gate of the eleventh transistor (NT11) is connected to the first node (N1), and the source of the eleventh transistor (NT11) is connected to the second power line (VSST). The drain of the twelfth transistor (NT12) is connected to the first node (N1), the gate of the twelfth transistor (NT12) is connected to the control terminal (CT), and the source of the twelfth transistor (NT12) is connected to the second power line terminal (VSST).

The carry output part 131e includes a fourteenth transistor (NT14). The drain of the fourteenth transistor (NT14) is connected to the clock terminal (CKT), the gate of the fourteenth transistor (NT14) is connected to the first node (N1), and the source of the fourteenth transistor (NT14) is connected to the carry output terminal (CR). Accordingly, the carry output part 131e transfers a clock signal (CK or CKB) to the input terminal (IN) of the next driving stage.

In the nth driving stage (SRCn), the carry signal (CR) outputted from the previous stage is inputted into the input terminal (IN) of the nth driving stage (SRCn), and the third transistor (NT3) is turned on by the carry signal (CR). The potential of the first node (N1) changes from the second power voltage level (VSS) to the first power voltage level (VDD). Then, the tenth transistor (NT10) is turned on according as the potential of the fourth transistor (NT4), fifth transistor (NT5) and first node (N1) increases. The potential of the second node (N2) is changed to the second power voltage level (VSS) when the tenth transistor (NT10) is turned on. Accordingly, the second transistor (NT2) is turned off.

The first transistor (NT1) is turned on according as the potential of the first node (N1) increases, the clock signal (CK) having a high voltage level is transferred to the output terminal (OUT). The output voltage of the output terminal (OUT) is charged in the bootstrap capacitor (C), and the voltage of the gate of the first transistor (NT1) increases more than the first power voltage level. Accordingly, the first transistor (NT1) maintains a turn-on state.

The twelfth and thirteenth transistors (NT12, NT13) are turned on when the output signal of the dummy stage (SRCn+1) having a high voltage level is outputted to the control terminal (CT) of the nth driving stage (SRCn).

The potential of the first node (N1) is changed from the first power voltage level (VDD) to the second power voltage level (VSS) when the twelfth transistor (NT12) is turned on. Then, the tenth transistor (NT10) is turned off. Accordingly, the potential of the second node (N2) is changed from the second power voltage level (VSS) to the first power voltage level (VDD) by the fourth and fifth transistors (NT4, NT5).

The output signal of the dummy stage outputted from the control terminal (CT) turns on the thirteenth transistor (NT13), and the thirteenth transistor (NT13) and the second transistor (NT2) outputs the second power voltage signal (VSS) to the output terminal (OUT).

The seventh and eighth transistors (NT7, NT8) are turned on when the first power voltage signal (VDD) is outputted to the output terminal (OUT) and the output signal of the (n−1)th driving stage applied to the input terminal (IN) of the nth driving stage is changed to the high voltage level.

Specifically, when the second power voltage signal (VSS) is outputted to the output terminal (OUT) and a high level output signal outputted from the (n−1)th driving stage is provided to the input node (IN), the eighth transistor (NT8) is turned on. Accordingly, the output signal outputted from the (n−1)th driving stage is discharged to the second power line terminal (VSST).

In addition, the ninth transistor (NT9) is turned on by the output signal of the dummy stage (SRCn+1) applied from the control terminal (CT) and discharges the high level output signal of the (n−1)th driving stage provided to the input node (IN), thereby preventing the first transistor (NT1) from being turned on.

Although the twelfth transistor (NT12) is turned off when the potential of the output signal of the dummy stage (SRCn+1) supplied from the control terminal (CT) is changed to a turn-off voltage level, the second node (N2) maintains the first power voltage level by the fourth and fifth transistors (NT4, NT5). Accordingly, the second transistor (NT2) maintains a turn-on state, and the second power signal (VSS) is outputted to the output terminal (OUT).

Figure 5:
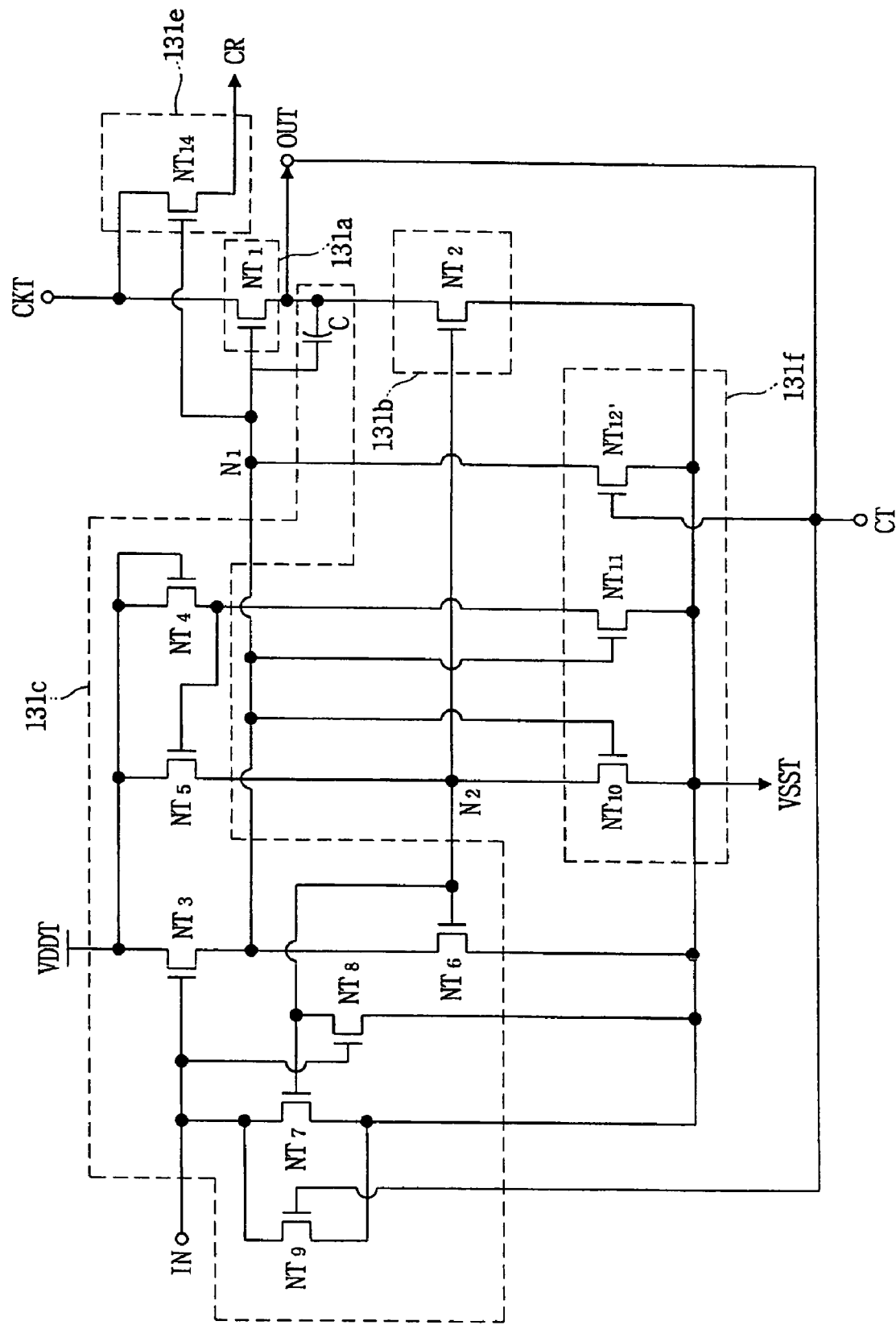
FIG. 5 is a circuit diagram showing the dummy stage of FIG. 2.
Figure 6:
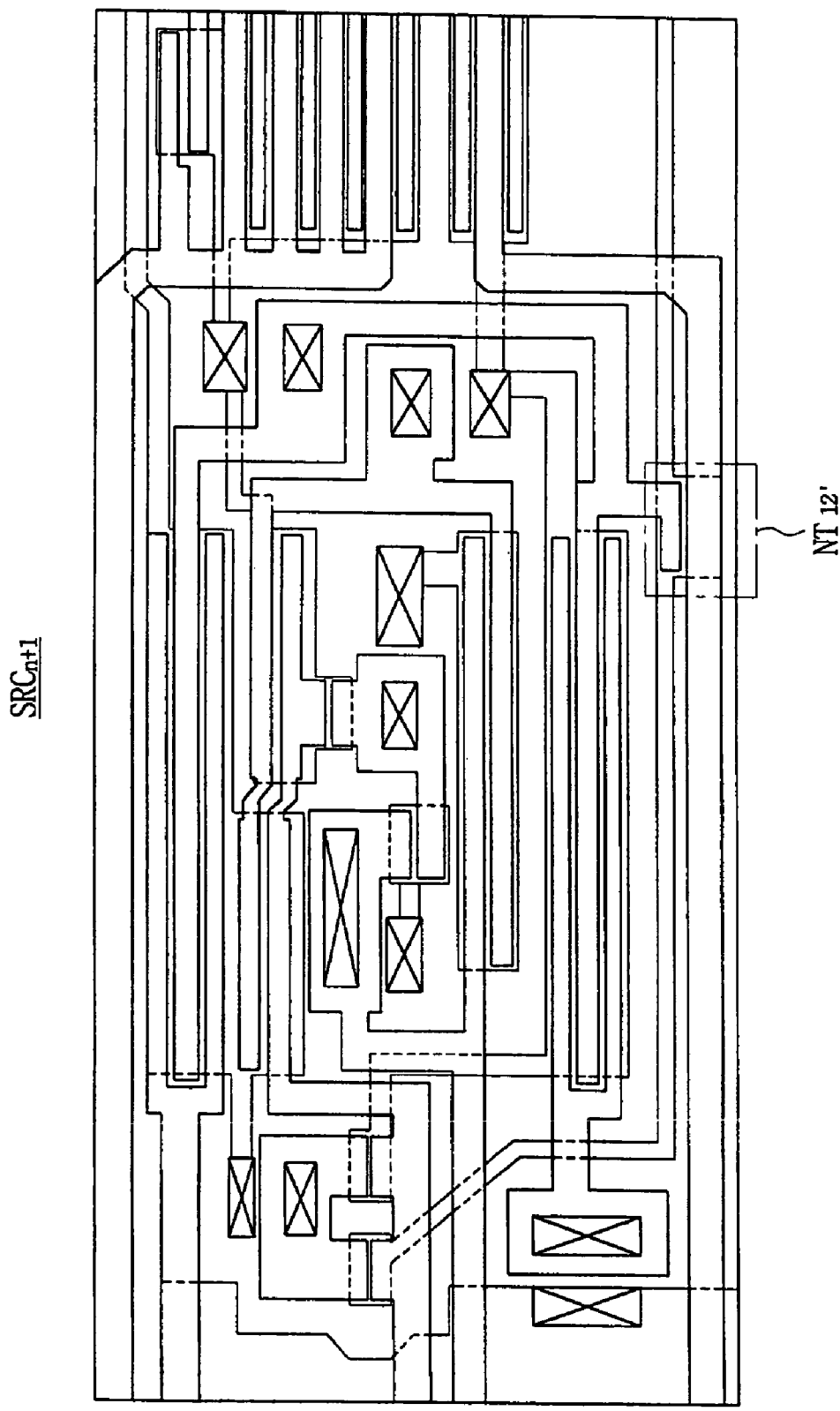
FIG. 6 is a plan view showing the layout of the dummy stage of FIG. 5.

FIG. 5 is a circuit diagram showing the dummy stage of FIG. 2, and FIG. 6 is a plane view showing the layout of the dummy stage of FIG. 5. In FIGS. 5 and 6, the same reference numerals denote the same elements of the nth driving stage (SRCn) in FIG. 1, and thus the detailed descriptions of the same elements will be omitted.

Referring to the FIGS. 5 and 6, the dummy stage (SRCn+1) includes a pull-up part 131a, a pull-down part 131b, a pull-up driver part 131c, a pull-down driver part 131d and a carry output part 131e. The control terminal of the dummy stage (SRCn+1) is connected to the output terminal of the dummy stage (SRCn+1). Accordingly, the dummy stage (SRCn+1) is controlled by the output signal of the dummy stage (SRCn+1).

The transistor size of the transistor (NT12') connected to the control terminal of the dummy stage (SRCn+1) is changed compared with the size of the transistor (NT12) of the nth driving stage (SRCn) so as to maintain the output signal of the dummy stage (SRCn+1) for a predetermined period. Hereinafter, a transistor size is referred to the ratio (W/L) of a channel width (W) of the transistor to a channel length (L) of the transistor.

For example, the transistor size of the transistor (NT12') of the dummy stage (SRCn+1) is about ten times smaller than that of the transistor (NT12) of the nth driving stage (SRCn).

Generally, the transistor size depends on the channel width (W). For example, the channel width (W') of the transistor (NT12') of the dummy stage (SRCn+1) is about ten times smaller than the channel width (W) of the transistor (NT12) of the nth driving stage (SRCn). As shown in FIGS. 4 and 6, the channel width (W') of the transistor (NT12') of FIG. 6 is about ten times smaller than the channel width (W) of the transistor (NT12) of FIG. 4.

Although the high level output signal of the dummy stage (SRCn+1) is feed back into the control terminal (CT) of the dummy stage (SRCn+1), the twelfth transistor (NT12') is turned on after a predetermined time depending on the transistor size of the transistor (NT12'). Accordingly, since tenth transistor (NT10) is not turned off shortly after the high level output signal of the dummy stage (SRCn+1) is feed back into the control terminal (CT) of the dummy stage (SRCn+1), the second node (N2) maintains the second power voltage level (VSS) for a predetermined period. Therefore, the output terminal of the dummy stage (SRCn+1) maintains the high voltage level for a predetermined period.

When the twelfth transistor (NT12') is turned on after a predetermined period, the tenth transistor (NT10) is turned off and the potential of the second node (N2) is changed from the second power voltage level (VSS) to the first power voltage level (VDD). The second transistor (NT2) is turned on according as the potential of the second node (N2) is changed to the first power voltage level (VDD), so that the second power voltage (VSS) is outputted to the output terminal (OUT) of the dummy stage (SRCn+1).

In addition, the thirteenth transistor (NT13) of the nth driving stage (SRCn) connected to the control terminal (CT) is removed in the dummy stage (SRCn+1). As shown in FIG. 6, the thirteenth transistor (NT13) of FIG. 4 is removed in the dummy stage (SRCn+1). Accordingly, since only the second transistor (NT2) outputs the second power voltage (VSS) to the output terminal (OUT), the second power voltage (VSS) is outputted to the output terminal (OUT) after a predetermined delay.

Figure 7:
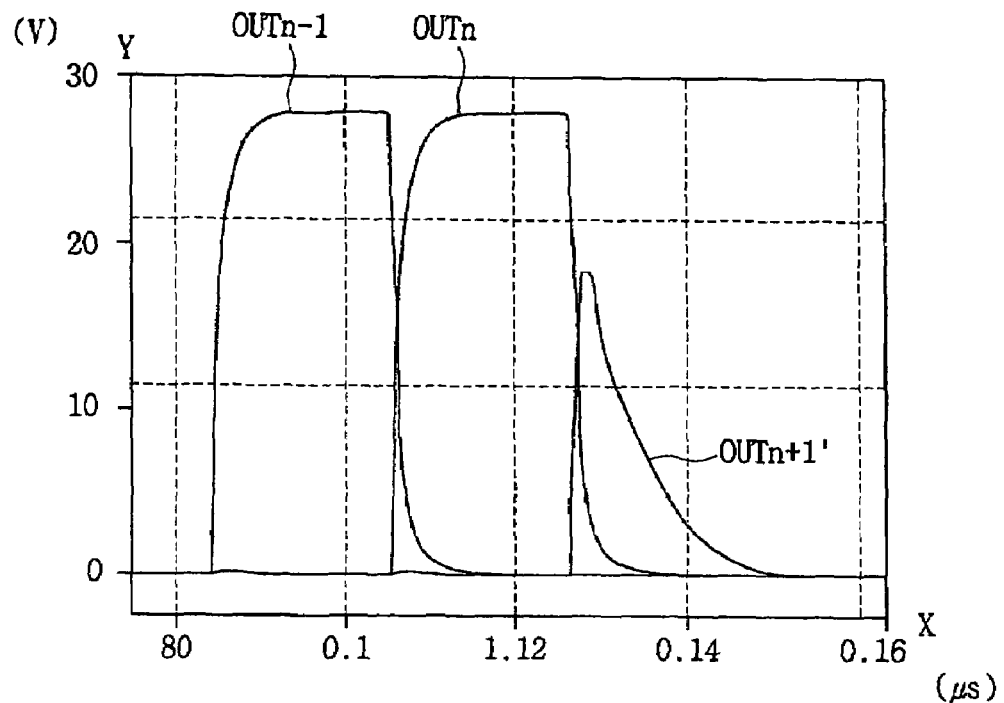
FIG. 7 is a graph showing the waveform of the output signal of the dummy stage having the same circuit as the driving stage of FIG. 2.
Figure 8:
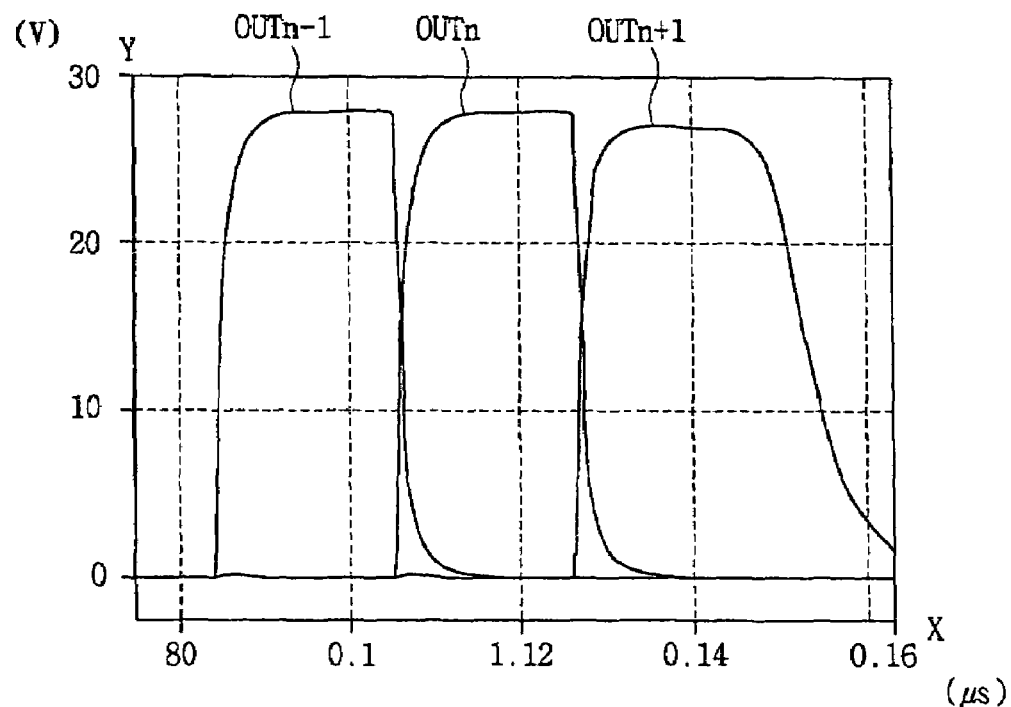
FIG. 8 is a graph showing the waveform of the output signal of the dummy stage of FIG. 5.

FIG. 7 is a graph showing the waveform of the output signal of the dummy stage having the same circuit as the driving stage of FIG. 2, and FIG. 8 is a graph showing the waveform of the output signal of the dummy stage of FIG. 5. The x-axis represents time (μm), and the y-axis represents voltage (V).

Referring to FIG. 7, the dummy stage (SRCn+1) is operated to output the output signal (OUTn+1') after the driving stages sequentially output the output signals (OUTn−1, OUTn) having a high voltage level. In FIG. 7, the dummy stage (SRCn+1) has the same circuit as the driving stages, and the output terminal of the dummy stage (SRCn+1) is connected to the control terminal of the dummy stage (SRCn+1). As soon as the potential of the output signal (OUTn+1') outputted from the output terminal of the dummy stage (SRCn+1) is changed into the high voltage level by the output signal (OUTn) of the nth driving stage (SRCn), the output signal (OUTn+1') having the high voltage level is applied to the control terminal of the nth driving stage (SRCn) and the control terminal of the dummy stage (SRCn+1).

The potential of the output signal (OUTn+1') outputted from the output terminal of the dummy stage (SRCn+1) is changed into a turn-off voltage level (or low voltage level) by the output signal (OUTn+1') that is feed back into the control terminal of the dummy stage (SRCn+1). Accordingly, the output signal (OUTn+1') does maintain the high voltage level for a predetermined period and is dropped down to a turn-off voltage level. The maximum voltage level of the output signal (OUTn+1') is much smaller than the maximum voltage level of the output signal (OUTn).

However, when the dummy stage (SRCn+1) has the circuit of FIG. 5, as shown in FIG. 8, the output signal (OUTn+1) has a more stable waveform compared with the output signal (OUTn+1'). The dummy stage (SRCn+1) is operated to output the output signal (OUTn+1) after the driving stages sequentially output the output signals (OUTn-1, OUTn) having a high voltage level.

As soon as the potential of the output signal (OUTn+1) outputted from the output terminal of the dummy stage (SRCn+1) is changed into a turn-on voltage level (or high voltage level) by the output signal (OUTn) of the nth driving stage (SRCn), the output signal (OUTn+1) having the turn-on voltage level is applied to the control terminal of the nth driving stage (SRCn) and the control terminal of the dummy stage (SRCn+1).

Then, although the output signal (OUTn+1) is applied to the control terminal of the dummy stage (SRCn+1), the output signal (OUTn+1) outputted from the output terminal of the dummy stage (SRCn+1) is not instantly changed into the turn-off voltage level, but the output signal (OUTn+1) outputted from the output terminal of the dummy stage (SRCn+1) is changed into the turn-off voltage level after a predetermined period. Therefore, the output signal (OUTn+1) maintains the high voltage level for the predetermined period.

The output signal (OUTn+1) is generated to have the voltage level almost the same as the output signal (OUTn). Therefore, the nth driving stage (SRCn) can be driven stably by the output signal (OUTn+1) of the dummy stage (SRCn+1).

Figure 9:
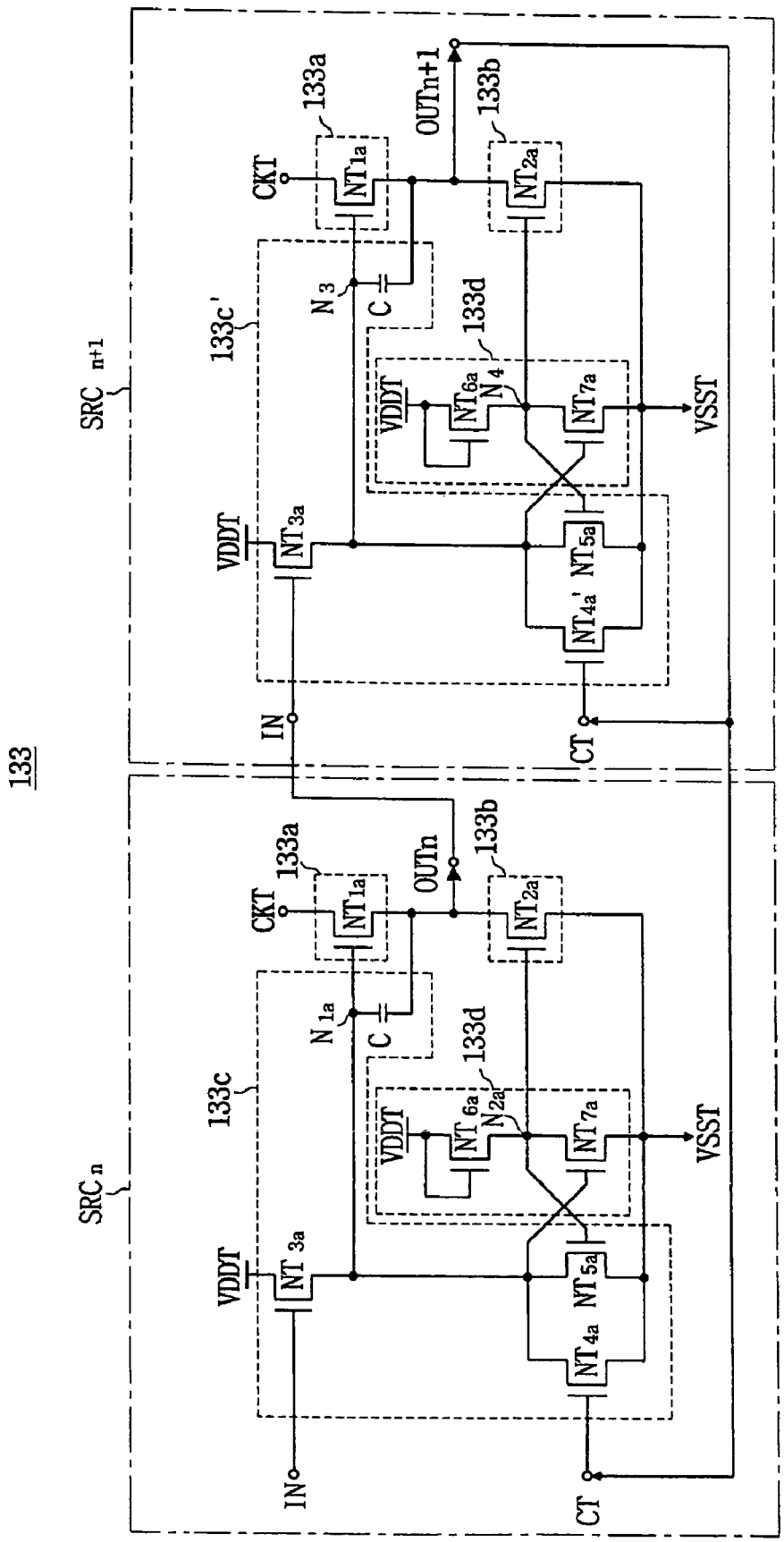
FIG. 9 is a circuit diagram showing the driving stage and dummy stage according to a second exemplary embodiment of the present invention.

FIG. 9 is a circuit diagram showing the driving stage and dummy stage according to a second exemplary embodiment of the present invention.

Referring to FIG. 9, the shift register 133 according to the second exemplary embodiment of the present invention includes n driving stages (SRC1, . . . , SRCn) and a dummy stage (SRCn+1). The nth driving stage (SRCn) includes a pull-up part 133a, a pull-down part 133b, a pull-up driver part 133c and a pull-down driver part 133d.

The pull-up part 131a includes a first NMOS transistor (NT1a). The clock signal (CK) is applied to the drain of the first NMOS transistor (NT1a), a gate of the first NMOS transistor (NT1a) is connected to a first node (N1a), and a source of the first NMOS transistor (NT1a) is connected to the output terminal (OUTn).

The pull-down part 131b includes a second NMOS transistor (NT2a). A drain of the second NMOS transistor (NT2a) is connected to the output terminal (OUTn), a gate of the second NMOS transistor (NT2a) is connected to a second node (N2a), and a source of the second NMOS transistor (NT2a) is connected to the second power line terminal (VSST).

The pull-up driver part 131c includes a capacitor (C), NMOS transistors (NT3a, NT4a, NT5a). The drain of a third transistor (NT3a) is connected to the first power line terminal (VDDT), the gate of the third transistor (NT3a) is connected to the input terminal (IN), and the source of the third transistor (NT3a) is connected to the first node (N1a). The drain of the fourth transistor (NT4a) is connected to the first node (N1a), the gate of the fourth transistor (NT4a) is connected to the control terminal (CT), and the source of the fourth transistor (NT4a) is connected to second power line terminal (VSST). The drain of the fifth transistor (NT5a) is connected to the first node (N1a), the gate of the fifth transistor (NT5a) is connected to the second node (N2a), and the source of the fifth transistor (NT5a) is connected to the second power line terminal (VSST). The transistor size of the third transistor (NT3a) is about two times larger than that of the fifth transistor (NT5a).

The pull-down driver part 133d includes NMOS transistors (NT6a, NT7a). In detail, the drain and gate of a sixth transistor (NT6a) are commonly connected to the second power line terminal (VDDT), and the source of the sixth transistor (NT6a) is connected to the second node (N2a). The drain of the seventh transistor (NT7a) is connected to the second node (N2a), the gate of the seventh transistor (NT7a) is connected to the first node (N1a), and the source of the seventh transistor (NT7a) is connected to the second power line terminal (VSST). The transistor size of the sixth transistor (NT6a) is about sixteen times larger than that of the seventh transistor (NT7a).

The seventh transistor (NT7a) is turned on when the output signal of the (n-1)th driving stage (SRCn-1) is outputted to the input terminal (IN) of the nth driving stage (SRCn). The potential of the second node (N2a) is changed from the first power voltage level (VDD) to the second power voltage level (VSS) when the seventh transistor (NT7a) is turned on. Then, even when the seventh transistor (NT7a) is turned on, the second node (N2a) maintains the second power voltage level (VSS) since the transistor size of the sixth transistor (NT6a) is about sixteen times larger than that of the seventh transistor (NT7a).

The seventh transistor (NT7a) is turned off when the output signal (OUTn+10 of the dummy stage (SRCn+1) having a high voltage level is feed back through the control terminal (CT) of the nth driving stage (SRCn). Accordingly, the potential of the second node (N2a) is changed from the second power voltage level (VSS) to the first power voltage level (VDD) by the sixth transistor (NT6a).

Even when the potential of the output signal of the dummy stage (SRCn+1) applied through the control terminal (CT) of the nth driving stage (SRCn) is changed to the turn-off voltage level and the fourth transistor (NT4a) is turned off, the second node maintain the first power voltage level (VDD) due to the sixth transistor (NT6a). Accordingly, the second transistor (NT2a) stays in a turn-on state and the output terminal (OUTn) has the second power voltage level (VSS).

As shown in FIG. 9, the dummy stage (SRCn+1) includes a pull-up part 131a, a pull-down part 131b, a pull-up driver part 131c' and a pull-down driver part 131d. The control terminal of the dummy stage (SRCn+1) is connected to the output terminal of the dummy stage (SRCn+1). Accordingly, the dummy stage (SRCn+1) is controlled by the output signal of the dummy stage (SRCn+1).

The transistor size of the transistor connected to the control terminal of the dummy stage (SRCn+1) is changed compared with the transistor size of the transistor connected to the control terminal of the nth driving stage (SRCn) so as to maintain the output signal of the dummy stage (SRCn+1) for a predetermined period.

For example, the transistor size of the transistor (NT4') of the dummy stage (SRCn+1) is about ten times smaller than that of the transistor (NT4) of the nth driving stage (SRCn). Accordingly, since the fourth transistor (NT4a') is not turned off shortly after the high level output signal of the dummy stage (SRCn+1) is feed back into the control terminal (CT) of the dummy stage (SRCn+1), the seventh transistor (NT7a) is not turned on immediately. The fourth node (N4) maintains the second power voltage level (VSS) for a predetermined period. Therefore, the output terminal of the dummy stage (SRCn+1) maintains the high voltage level for a predetermined period.

When the fourth transistor (NT4') is turned on after a predetermined period, the seventh transistor (NT7a) is turned off and the potential of the fourth node (N4) is changed from the second power voltage level (VSS) to the first power voltage level (VDD). The second transistor (NT2a) is turned on according as the potential of the fourth node (N4) is changed to the first power voltage level (VDD), so that the second power voltage (VSS) is outputted to the output terminal (OUT) of the dummy stage (SRCn+1).

Since the control terminal (CT) of the dummy stage (SRCn+1) is connected to the output terminal (OUTn+1) of the dummy stage (SRCn+1), the dummy stage (SRCn+1) may maintain stable operation. Further more, the gate driver circuit does not require another external wiring through which control signal is applied to the control terminal (CT) of the dummy stage (SRCn+1).

Accordingly, the capacitance between the external wiring and other wirings may be prevented, and the signals applied to the gate driver circuit may not be delayed.

Figure 10:
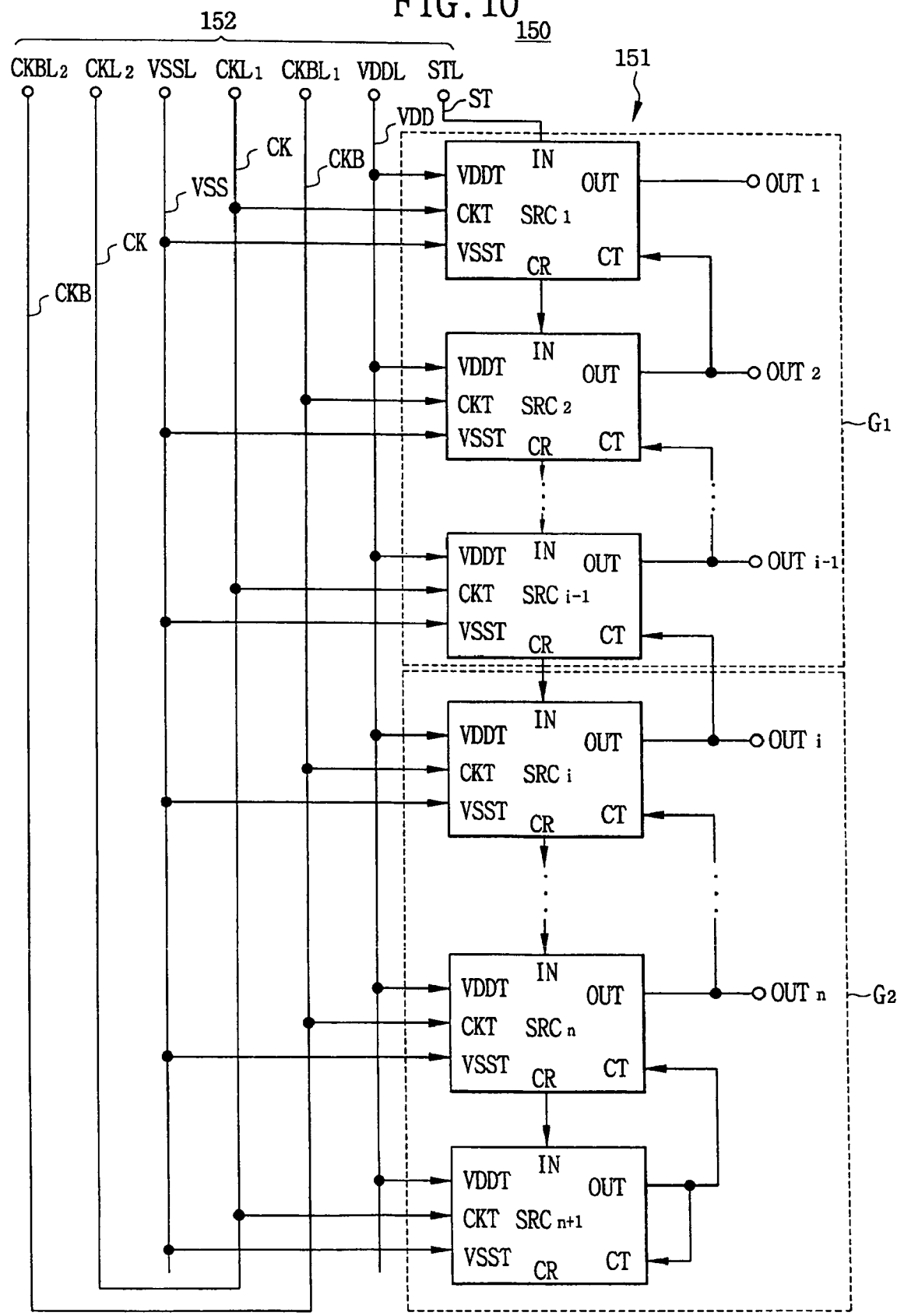
FIG. 10 is a block diagram showing the shift register of the driving the gate driver circuit according to a third exemplary embodiment of the present invention.
Figure 11:
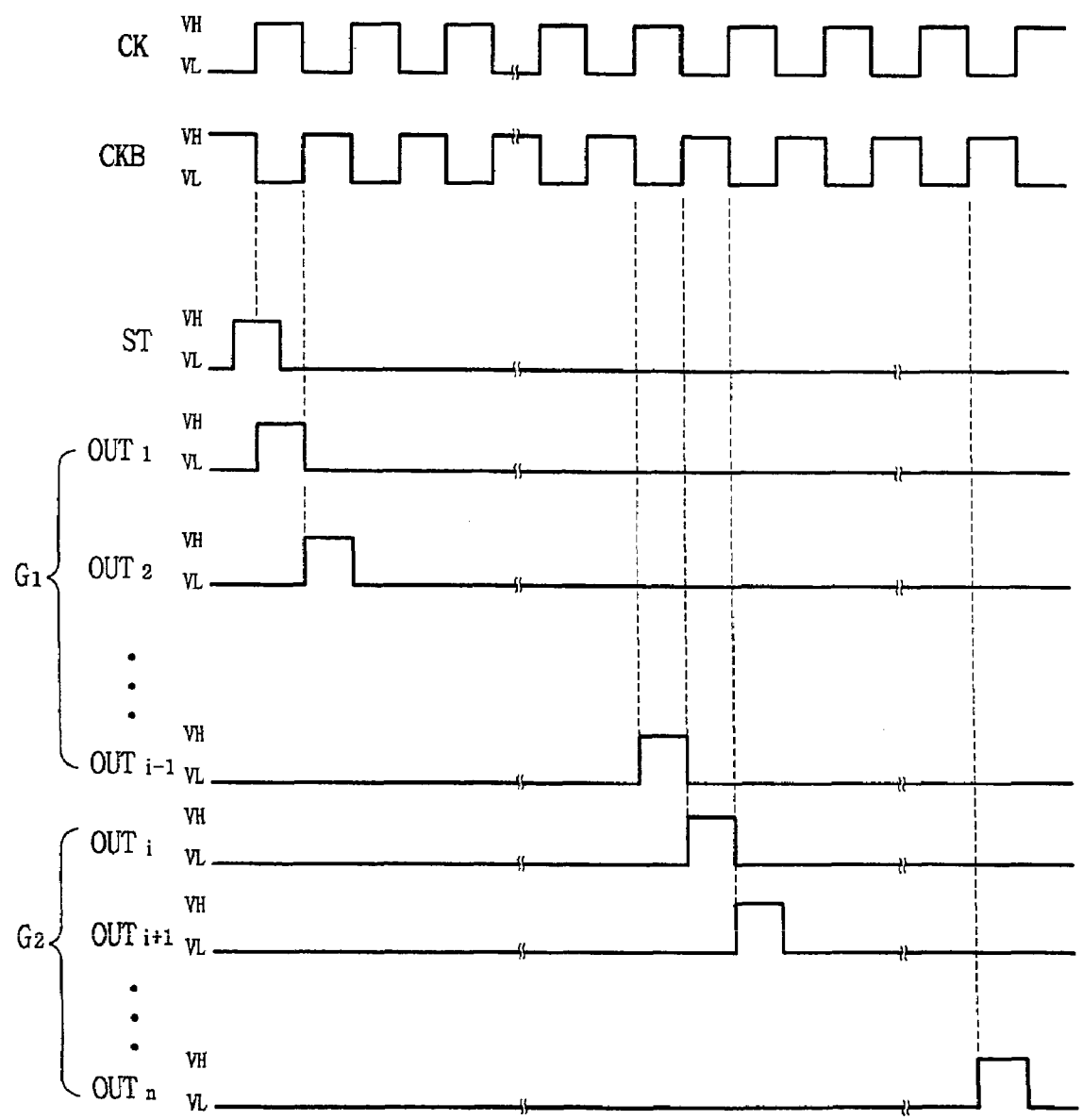
FIG. 11 is a graph showing the waveform of the output signal of the gate driver circuit of FIG. 10.

FIG. 10 is a block diagram showing the shift register of the driving the gate driver circuit according to a third exemplary embodiment of the present invention, and FIG. 11 is a graph showing the waveform of the output signal of the gate driver circuit of FIG. 10. Hereinafter, 'i' is an even number less than 'n'.

Referring to FIG. 10, the gate driver circuit 150 according to a third exemplary embodiment of the present invention includes a shift register 151. The shift register 151 is divided into a first group G1 and a second group G2. Each of the first and second group G1 and G2 includes a plurality of stages. A wring part 152 is disposed adjacent to the shift register 151. The wring part 152 provides the shift register 151 with a plurality of signals. In detail, the wiring part 152 includes a start signal line (STL), a first power line (VDDL), a first clock line (CKL1), a second clock line (CKBL1), a second power line (VSSL), a third clock line (CKL2) and a fourth clock line (CKBL2).

A first clock signal (CK) is applied to odd number of driving stages (SRC1, SRC3, . . . ) of the driving stages (SRC1, . . . , SRCi−1) in the first group G1 through the first clock line (CKL1). The first clock signal (CK) is applied to odd number of driving stages (SRCi+1) of the driving stages (SRCi, . . . , SRCn) in the second group G2 through the third clock line (CKL2). A second clock signal (CKB) having a 180° different phase with respect to the first clock signal (CK) is applied to the even number of driving stages (SRC2, . . . ) of the driving stages (SRC1, . . . , SRCi−1) in the first group G1 through the second clock line (CKBL1). The second clock signal (CKB) is applied to the even number of driving stages (SRCi, . . . , SRCn) of the driving stages (SRCi, . . . , SRCn) in the second group G2 through the fourth clock line (CKBL2).

Accordingly, some parts of the n driving stages (SRC1, . . . , SRCn) operates in response to the first and second clock signals CK and CKB that are applied to the n driving stages (SRC1, . . . , SRCn) through the first and second clock lines CKL1 and CKBL1, respectively. Other parts of the n driving stages (SRC1, . . . , SRCn) operates in response to the first and second clock signals CK and CKB that are applied to the n driving stages (SRC1, . . . , SRCn) through the third and fourth clock lines CKL2 and CKBL2, respectively. Therefore, the delay of the first and second clock signals CK and CKB, which have turn-on voltage level and are applied sequentially to the first gate line, second gate line, . . . , and the nth gate line, may be minimized, so that the distortion of the output signal outputted from each of the stages may be prevented.

The third and fourth clock lines CKL2 and CKBL2 does not cross the other wirings (VSSL, VDDL, STL, etc.) so as to be connected to each of the n driving stages (SRC1, . . . , SRCn). Ends of the third and fourth clock lines CKL2 and CKBL2 are connected to ends of the first and second clock lines CKL1 and CKBL1, respectively, to be connected to each of the n driving stages (SRC1, . . . , SRCn).

Specifically, the first end of the third clock line CKL2 into which the first clock signal CK is inputted is disposed adjacent to the first end of the first clock line CKL1 into which the first clock signal CK is inputted. The first end of the second clock line CKBL1 into which the second clock signal CKB is inputted is disposed adjacent to the first end of the fourth clock line CKBL2 into which the second clock signal CKB is inputted. In other words, the input terminals of the first, second, third and fourth clock lines (CKL1, CKBL1, CKL2, CKBL2) is disposed adjacent to the first driving stage (SRC1).

The second end of the first clock line CKL1 is connected to the second end of the third clock line CKL2 in the vicinity of the dummy stage (SRCn+1).

The third and fourth clock lines CKL2 and CKBL2 are not directly connected to the shift register 151 and do not cross the other wirings. Accordingly, the first and second clock signals CK and CKB may travel through the third and fourth clock lines CKL2 and CKLB2 faster than through the first and second clock lines CKL1 and CKBL1.

In addition, the narrower the width of the wiring is, the more adjacent to the shift register 151 is disposed the wiring.

Specifically, the start signal line STL is disposed nearest the shift register 151, and the first power line VDDL is disposed next to the start signal line STL. The first and second clock lines CK1 and CKBL1 are sequentially disposed next to the first power line VDDL. The second power line VSSL is disposed next to the first clock line CKL1. The third clock line CKL2 is disposed next to the second power line VSSL. The fourth clock line CKLB2 is disposed next to the third clock line CKL2.

Since the wirings of the wiring part 152 are disposed in above-mentioned order, the LCD device can provide enhanced display quality. The more adjacent to the shift register 151 the wiring is disposed, the larger is the total contact area between the wirings and the larger is the capacitance between the wirings that contacts each other. Therefore, the less the wiring is influenced by the capacitance between the wirings, the nearer the shift register 151 is disposed the wiring. Therefore, the LCD device may provide enhanced display quality.

Referring to FIG. 11, the first and second clock signals CK and CKB are supplied to the first group G1 of the shift register 151 through the first and second clock lines CKL1 and CKBL1. When the start signal ST is applied to the first driving stage SRC1 of the first group G1, the first driving stage SRC1 outputs a first output signal OUT1 having the high voltage level of the first clock signal CK in response to the start signal ST. Then, the second driving stage SRC2 outputs a second output signal OUT2 having the high voltage level of the second clock signal CKB in response to the first output signal OUT1 of the first driving stage SRC1.

When the first and second clock signals CK and CKB is supplied to the second group G2 of the shift register 151 through the third and fourth clock lines CKL2 and CKBL2, the (i) th driving stage SRCi—i.e. the first driving stage of the second group G2-outputs an (i) th output signal OUTi having the high voltage level of the second clock signal CKB in response to the (i−1) th output signal OUTi−1 of the (i−1) th driving stage SRCi−1. Then, the (I+1) th driving stage SRCi+1 outputs an (I+1) th output signal OUTi+1 having the high voltage level of the first clock signal CK in response to the (i) th output signal OUTi of the (i) th driving stage SRCi.

As mentioned above, the first, second, . . . , and (n) th output signals (OUT1, OUT2, . . . , OUTn) are outputted to sequentially have the high voltage level at the output terminals of each of the driving stages outputs.

Figure 12:
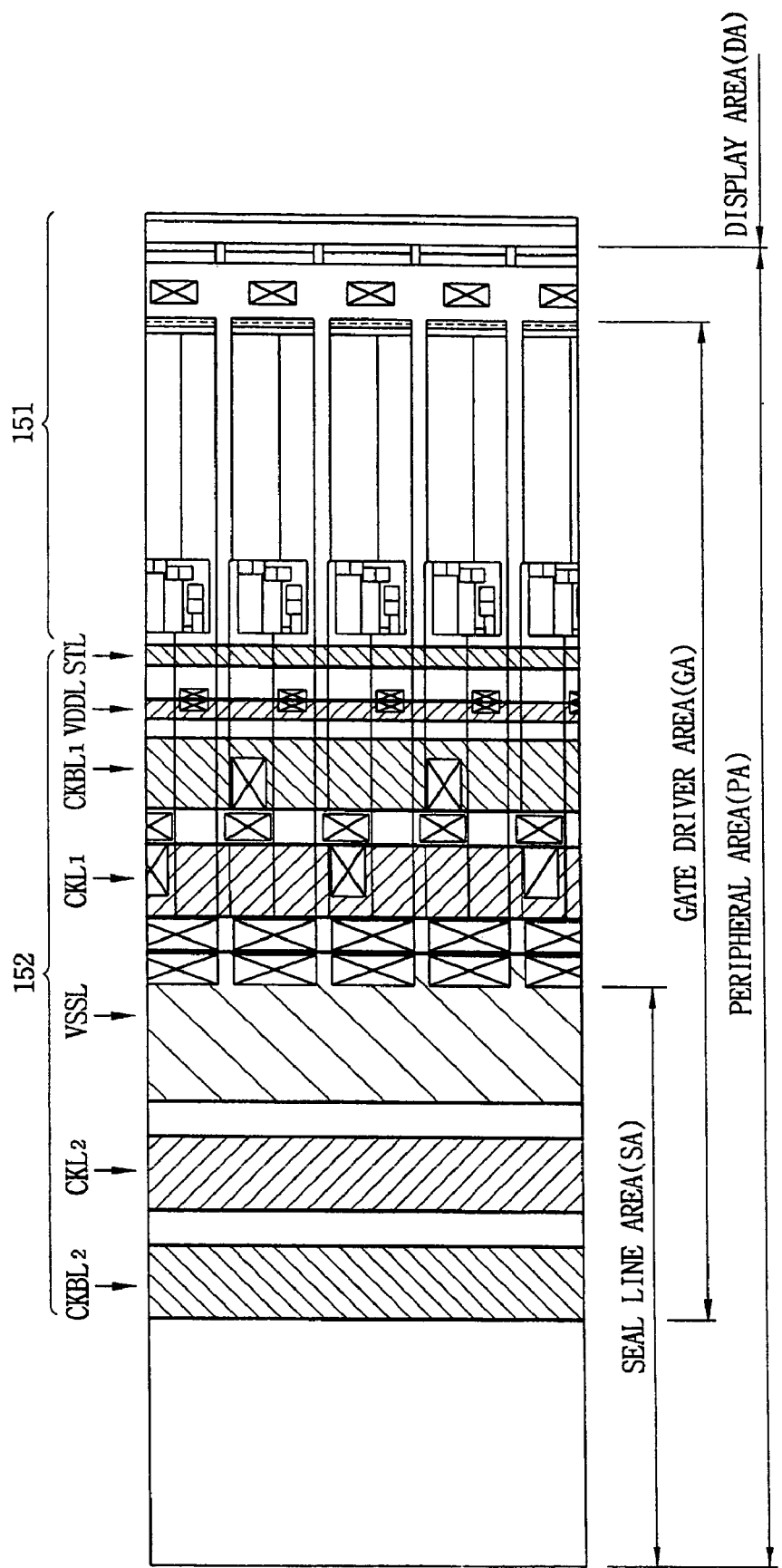
FIG. 12 is a layout showing the arrangement of the third and fourth clock lines of the gate driver circuit of FIG. 10.
Figure 13:
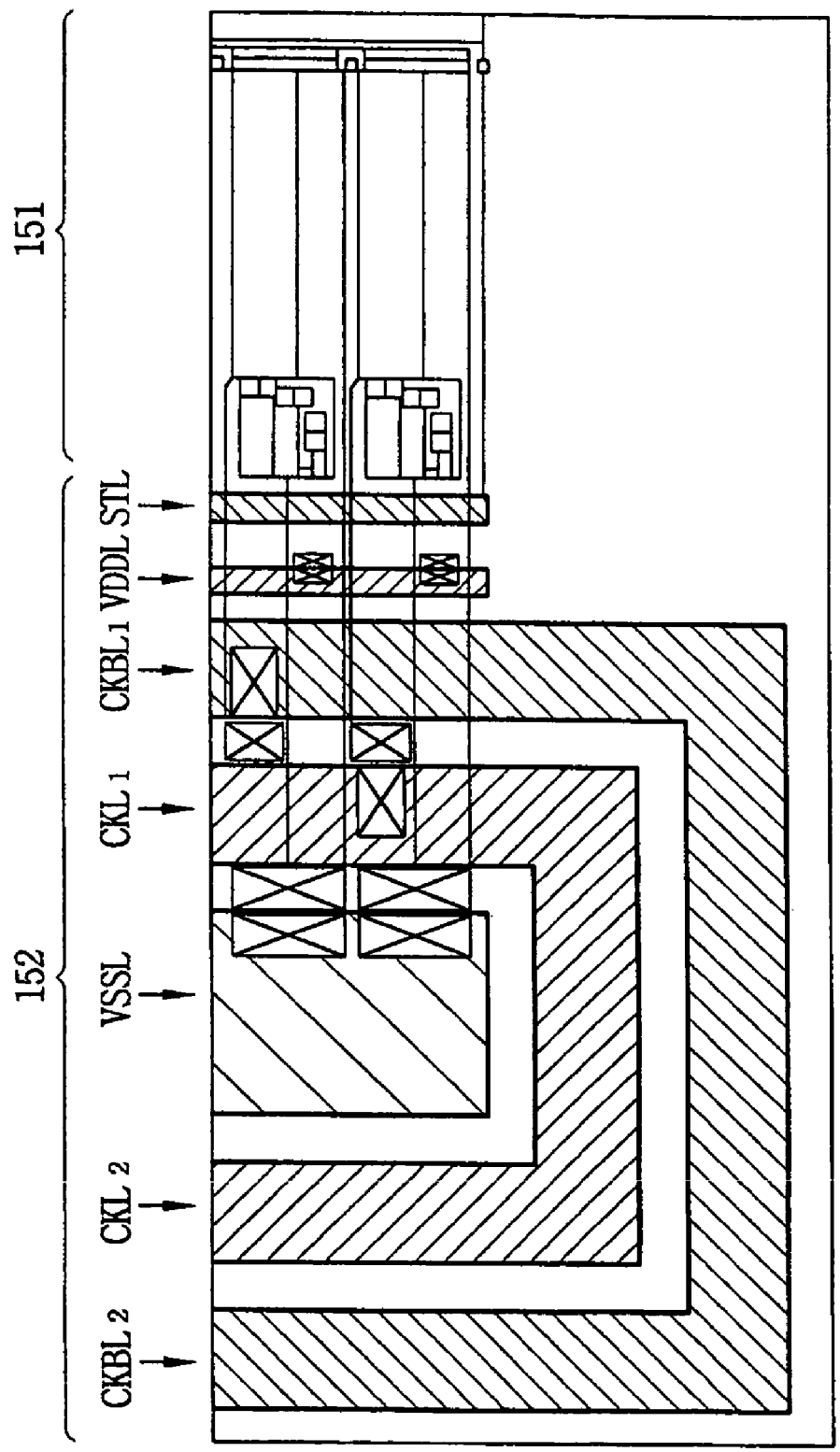
FIG. 13 is a layout showing another example of the connection between the first, third, second and fourth clock lines of the shift register.

FIG. 12 is a layout showing the arrangement of the third and fourth clock lines of the gate driver circuit of FIG. 10, and FIG. 13 is a layout showing another example of the connection between the first, third, second and fourth clock lines of the shift register.

Referring to FIG. 12, the start signal line STL, the first power line VDDL, the first and second clock lines CKL1 and CKBL1, the second power line VSSL, the third and fourth clock lines CKL2 and CKBL2 are sequentially disposed beside the shift register 151. The narrower the width of each of the wirings is, the more adjacent to the shift register 151 is disposed each of the wirings. In other words, the width of the wiring that is disposed far from the shift register 151 is not less than the width of the wiring that is disposed near the shift register 151. The more adjacent to the shift register 151 the wiring is disposed, the larger is the total contact area between the wirings and the larger is the capacitance between the wirings that contacts each other. Therefore, the less the wiring is influenced by the capacitance between the wirings, the nearer the shift register 151 is disposed the wiring.

Specifically, the start signal line STL is disposed nearest the shift register 151, and the first power line VDDL is disposed next to the start signal line STL. The first and second clock lines CK1 and CKBL1 are sequentially disposed next to the first power line VDDL. The second clock line CKBL1 is disposed nearer the shift register 151 than the first clock line CKL1. The second power line VSSL is disposed next to the first clock line CKL1. Therefore, the signal delay due to capacitance between the wiring and the connection line for connecting the wiring to each of the stages (SRC1, . . . , SRCn+1) may be reduced. The third and fourth clock lines CKL2 and CKBL2 does not cross the other wirings (VSSL, VDDL, STL, etc.) so as to be connected to the shift register 151. Since ends of the third and fourth clock lines CKL2 and CKBL2 are connected to ends of the first and second clock lines CKL1 and CKBL1, respectively to be connected to the shift register 151, the third and fourth clock lines CKL2 and CKBL2 are disposed farther from the shift register than the second power line VSSL. In other words, the third and fourth clock lines CKL2 and CKBL2 are disposed the exterior of the second power line VSSL. As shown in FIG. 12, the third and fourth clock lines CKL2 and CKBL2 is formed in the seal line area (SA) of the TFT substrate 300.

The TFT substrate 300 is divided into a display area (DA) and a peripheral area (PA) surrounding the display area (DA). Gate lines (not shown), data lines (not shown) and pixels (not shown) are formed in the display area (DA).

The peripheral area (PA) is divided into a gate driving area (GA) and a seal line area (SA). The shift register 151 and various wirings are formed in the gate driving area (GA). Sealant (not shown) for engaging the TFT substrate with the color filter substrate (not shown) is formed in the seal line area (SA). A portion of the seal line area (SA) and a portion of the gate driving area (GA) are overlapped with each other. The seal line area (SA) is divided into first and second area. The liquid crystal layer is formed in the first area of the seal line area (SA), and the liquid crystal layer is not formed in the second area of the seal line area (SA). The gate driving area (GA) includes the first area.

The third and fourth clock lines CKL2 and CKBL2 and a portion of the second power line VSSL is formed in the seal line area (SA). The other portion of the second power line VSSL, the first and second clock lines CKL1 and CKBL1 and the start signal line STL is formed in the gate driving area (GA).

A portion of the second power line VSSL, the first and second clock lines CKL1 and CKBL1, the first power line VDDL and the start signal line STL contact a portion of the connection line. Accordingly, contact failure may occur during the process by which the TFT substrate 300 is combined with the color filter substrate under high temperature and high pressure when the portion of the second power line VSSL, the first and second clock lines CKL1 and CKBL1, the first power line VDDL and the start signal line STL are formed in the seal line area (SA).

The wirings that contact a portion of the connection line are formed in the gate driving area (GA), and wirings that do not contact the connection line are formed in the seal line area (SA). Therefore, the increase of the whole size of the LCD device may be prevented. Specifically, the other portion of the second power line VSSL and the third and fourth clock lines CKL2 and CKBL2 may be formed in the seal line area (SA) since the other portion of the second power line VSSL and the third and fourth clock lines CKL2 and CKBL2 do not contact the connection line.

Even when the third and fourth clock lines CKL2 and CKLB2 are further formed in the peripheral area (PA), the whole size of the LCD device may not increase. In addition, since the third and fourth clock lines CKL2 and CKLB2 are formed the seal line area (SA) in which the liquid crystal layer is not formed, the capacitance due to the third and fourth clock lines CKL2 and CKLB2 is not exist. Therefore, the delay of the first and second clock signals CK and CKB are much decreased compared with the first and second clock lines CKL1 and CKBL1.

Referring to FIG. 13, one end of the first clock line CKL1 is connected to one end of the third clock line CKL2, and one end of the second clock line CKBL1 is connected to one end of the fourth clock line CKBL2. Accordingly, the first clock signal CK is supplied to each of the stages of the shift register through the third clock line CKL2, and the second clock signal CK is supplied to each of the stages of the shift register through the fourth clock line CKBL2.

As shown in FIGS. 12 and 13, the third and fourth clock lines CLK2 and CKBL2 are not directly connected to the shift register 151 and do not cross the other wirings. Accordingly, the first and second clock signals CK and CKB may travel through the third and fourth clock lines CKL2 and CKLB2 faster than through the first and second clock lines CKL1 and CKBL1.

Some of the stages (SRC1, . . . , SRCn+1) is operated by the first and second clock signals CK and CKB applied thereto through the first and second clock lines CKL1 and CKBL1, and the others of the stages (SRC1, . . . , SRCn+1) is operated by the first and second clock signals CK and CKB applied thereto through the third and fourth clock lines CKL2 and CKBL2.

Therefore, the delay of the first and second clock signals CK and CKB, which have high voltage level and are applied sequentially to the first gate line, second gate line, . . . , and the nth gate line, may be minimized, so that the distortion of the output signal outputted from each of the stages of the shift register may be prevented.

Figure 14:
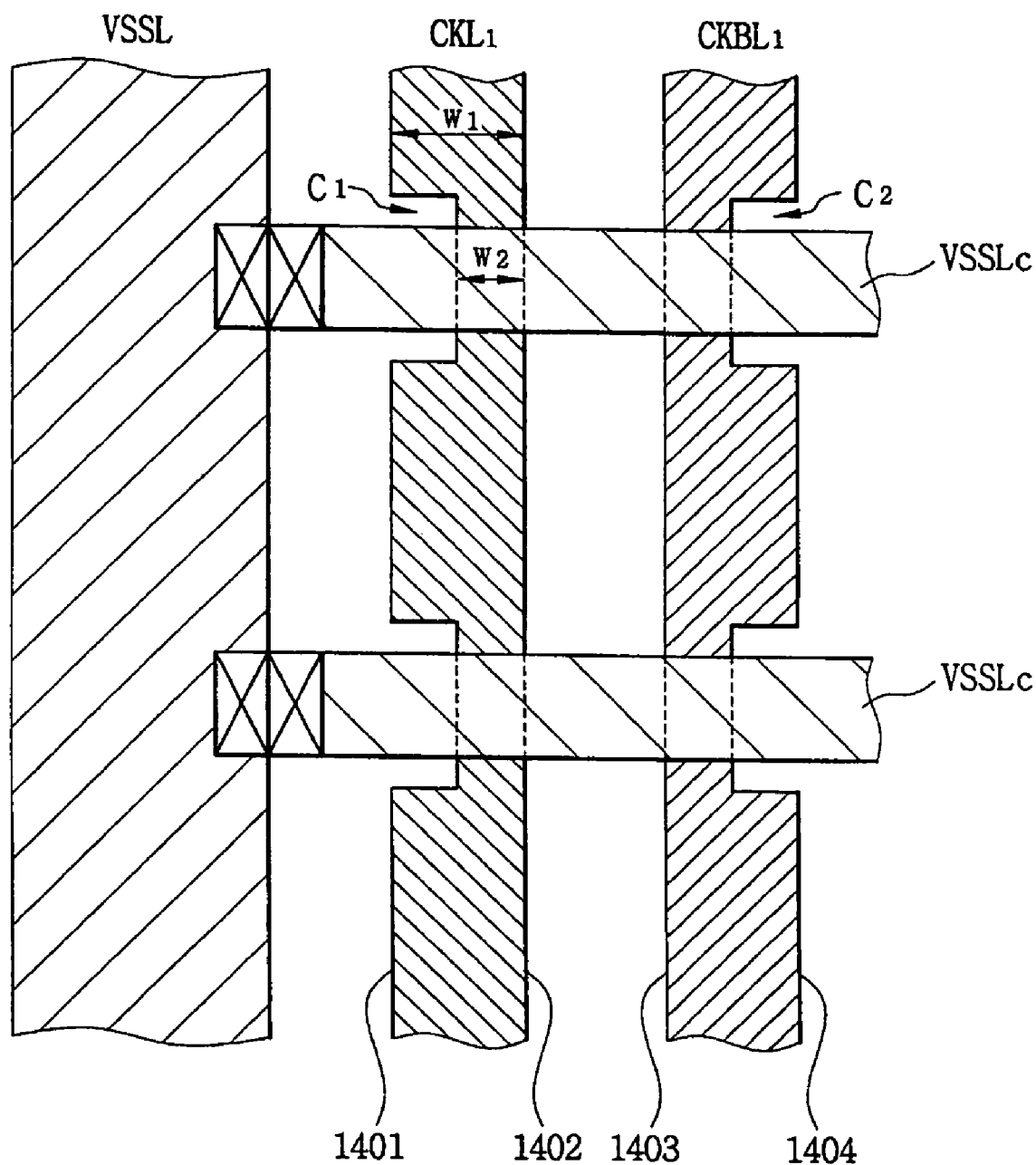
FIG. 14 is a layout showing the wiring structure of the shift register according to a fourth exemplary embodiment of the present invention.
Figure 15:
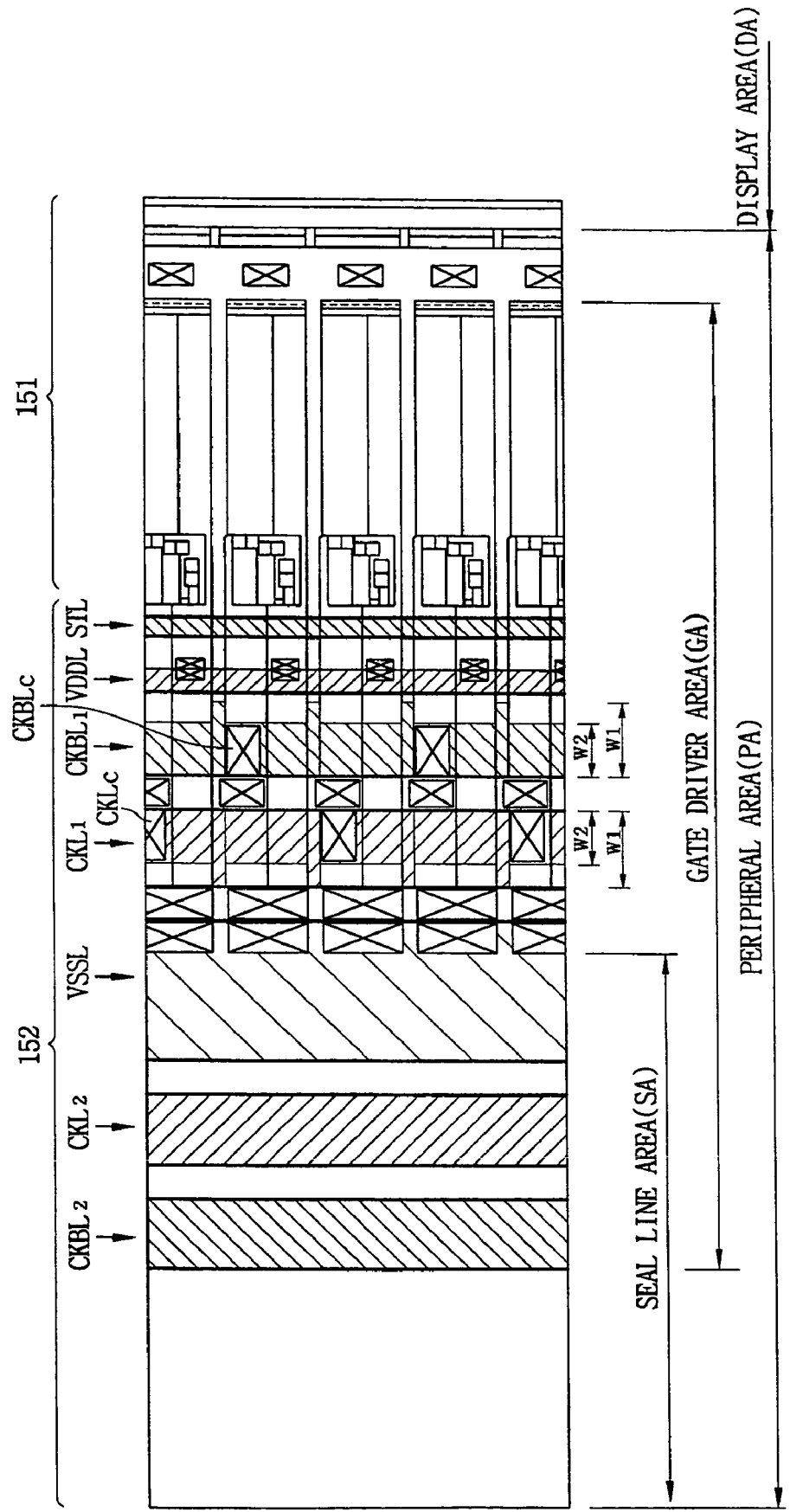
FIG. 15 is a layout showing the shift register having the wiring structure of FIG. 14.

FIG. 14 is a layout showing the wiring structure of the shift register according to a fourth exemplary embodiment of the present invention, and FIG. 15 is a layout showing the shift register having the wiring structure of FIG. 14.

Referring to FIGS. 14 and 15, a first connection line VSSLc for connecting the second power line VSSL to each of the stages is disposed between the second power line VSSL and the shift register (not shown). The first and second clock lines CKL1 and CKBL1 in parallel with the second power line VSSL are disposed between the second power line VSSL and the shift register.

The first connection line VSSLc crosses the first and second clock lines CKL1 and CKBL1. Each of the first and second clock lines CKL1 and CKBL1 has a first width W1 at a first portion thereof over which the first connection line VSSLc does not crosses and has a second width W2 at a second portion thereof over which the first connection line VSSLc crosses. The second width W2 is smaller than the first width W1.

Specifically, the first clock line CKL1 has a first recess C1 corresponding to the second portion thereof over which the first connection line VSSLc crosses. The second clock line CKLB1 has a second recess C2 corresponding to the second portion thereof over which the first connection line VSSLc crosses.

The first clock line CKL1 has first and second sidewalls 1401 and 1402 extended in a longitudinal direction, and the second clock line CKBL1 has third and fourth sidewalls 1403 and 1404 extended in the longitudinal direction. The second sidewall 1402 of the first clock line CKL1 faces the third sidewall 1403 of the second clock line CKBL1. The first recess C1 is formed in the first sidewall 1401, and the second recess C2 is formed in the fourth sidewall 1404.

As shown in FIGS. 14 and 15, a first clock connection line CKLc for providing each of the stages with the first clock signal (CLK) is disposed between the first clock line CKL1 and the shift register 151. A second clock connection line CKBLc for providing each of the stages with the second clock signal (CLB) is disposed between the second clock line CKBL1 and the shift register 151. The first clock connection line CKLc contacts the first clock line CKL1 in the vicinity of the second sidewall 1402 of the first clock line CKL1. The second clock connection line CKBLc contacts the second clock line CKBL1 in the vicinity of the third sidewall 1403 of the second clock line CKBL1. For example, the first and second recesses C1 and C2 may be formed at portions of the first and second clock lines CKL1 and CKBL1 where the first and second clock lines CKL1 and CKBL1 do not overlap the first and second clock connection lines CKLc and CKBLc.

The capacitance generated at the portion where the first and second clock lines CK1 and CKB1 overlap the first connection line VSSLc may be reduced. Therefore, the delay of the first and second clock signals CK and CKB applied to the shift register through the first and second clock lines CKL1 and CKBL1 may be reduced. In addition, the delay of the second power voltage signal VSS applied to the shift register through the first connection line VSSLc may be reduced.

A resistance generated at the portion where the first and second clock lines CK1 and CKB1 overlap the first connection line VSSLc may increase since some portions of the first and second clock lines CKL1 and CKBL1 has narrow width (W2). However, the signal delay may be reduced since the signal delay is more greatly influenced by the capacitance rather than by the resistance.

Hereinafter, the RC delay varying according to the resistance and capacitance is shown in the example and comparative example of Table 1. In the example, the first width (W1) of each of the first and second clock lines CKL1 and CKBL1 is 70 μm, and the second width (W2) of each of the first and second clock lines CKL1 and CKBL1 is 45 μm. In the comparative example, the first and second widths (W1, W2) of each of the first and second clock lines CKL1 and CKBL1 are 70 μm.

TABLE 1

| | CKL1(CKBL1) | | | |
| --- | --- | --- | --- | --- |
| | W1 | W2 | C | R |
| Comparative Example | 70 μm. | 70 μm. | 385 pF | 457 Ω |
| Example | 70 μm. | 45 μm. | 344.5 pF | 489 Ω |

As shown in Table 1, in the comparative example, the first capacitance between the first and second clock lines (CKL1, CKBL1) and the first connection line VSSLc is 385 pF. In the example, the second capacitance between the first and second clock lines (CKL1, CKBL1) and the first connection line VSSLc is 344.5 pF. The second capacitance of the example is decreased by about 10.5% compared with the first capacitance of the comparative example.

In the comparative example, the first resistance of the first and second clock lines (CKL1, CKBL1) is 457Ω. In example, the second resistance of the first and second clock lines (CKL1, CKBL1) is 489Ω. The second resistance of the example is increased by about 7% compared with the first resistance of the comparative example. However, since the ratio of decrease of the second capacitance is larger than the ratio of increase of the second resistance, the RC delay decreases.

Figure 16:
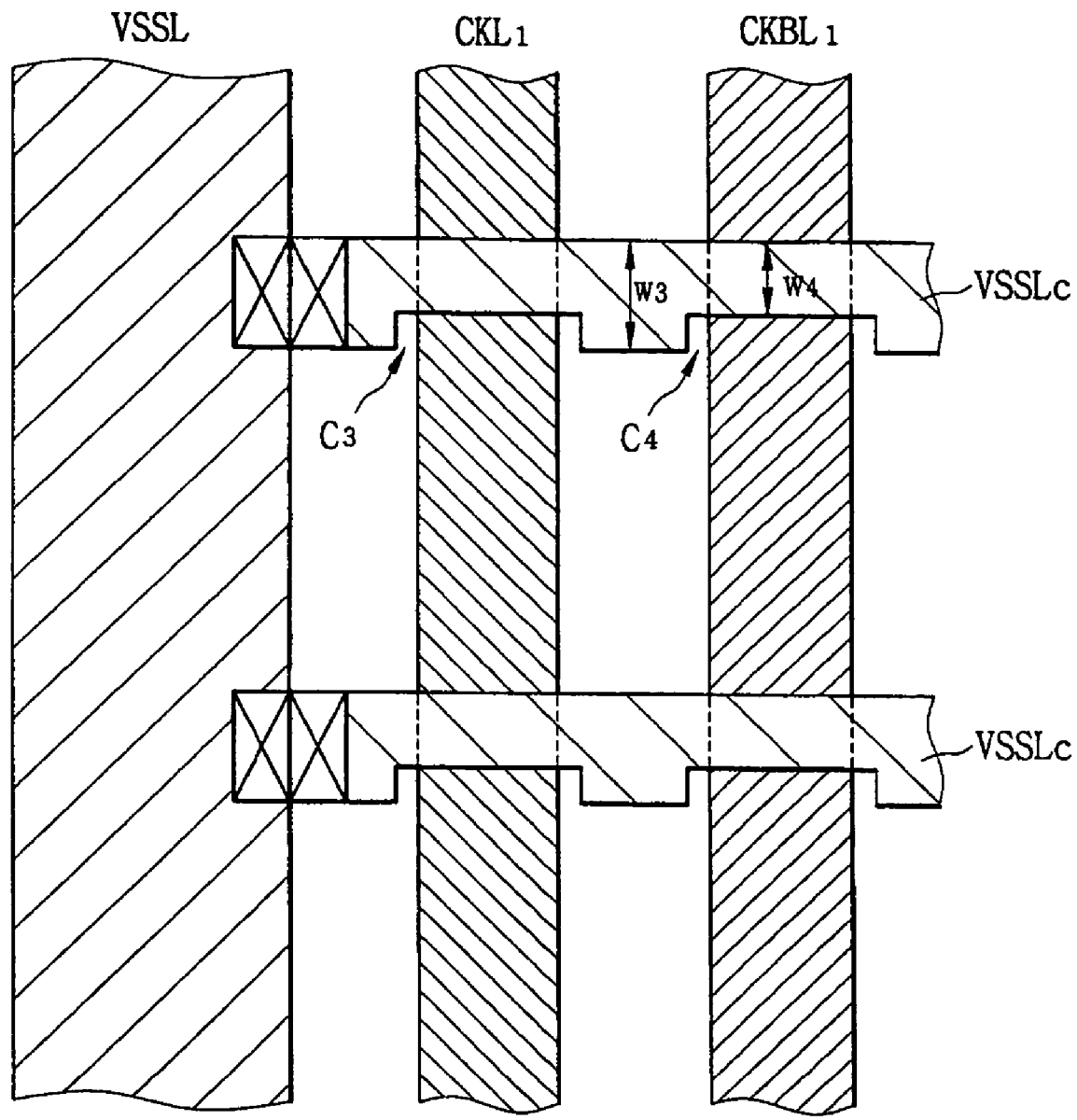
FIG. 16 is a layout showing the wiring structure of the shift register according to a fifth exemplary embodiment of the present invention.

FIG. 16 is a layout showing the wiring structure of the shift register according to a fifth exemplary embodiment of the present invention.

Referring to FIGS. 14 and 15, a first connection line VSSLc for connecting the second power line VSSL to each of the stages is disposed between the second power line VSSL and the shift register (not shown). The first and second clock lines CKL1 and CKBL1 in parallel with the second power line VSSL are disposed between the second power line VSSL and the shift register.

The first connection line VSSLc crosses the first and second clock lines CKL1 and CKBL1. The first connection line VSSLc has a third recess C3 corresponding to a third portion thereof over which the first clock line CKL1 crosses. The first connection line VSSLc has a fourth recess C4 corresponding to a fourth portion thereof over which the second clock line CKBL1 crosses. The first connection line VSSLc has the third width W3 at a portion thereof over which the first and second clock lines CKL1 and CKBL1 do not cross and has a fourth width W4 at another portion thereof over which the first and second clock lines CKL1 and CKBL1 cross. The fourth width W4 is smaller than the third width W3.

Since the first connection line VSSLc has a narrow width corresponding to the portions thereof over which the first and second clock lines CKL1 and CKBL1 cross, the capacitance between the first and second clock lines (CKL1, CKBL1) and the first connection line VSSLc may be reduced. Therefore, the delay of the first and second clock signals CK and CKB applied to the shift register through the first and second clock lines CKL1 and CKBL1 may be reduced. In addition, the delay of the second power voltage signal VSS applied to the shift register through the first connection line VSSLc may be reduced.

According to above-mentioned gate driver circuit, since the dummy output terminal of the dummy stage (SRCn+1) is connected the control terminal of the last driving stage (SRCn) and also connected to the dummy control terminal of the dummy stage (SRCn+1), the delay of the signals applied to the gate driver circuit may be prevented.

In addition, since the structure of the transistor connected to the control terminal of the dummy stage (SRCn+1) is changed, the output signal of the dummy stage (SRCn+1) may be outputted normally, and the LCD device may provide enhanced display quality.

In addition, since the wiring part further includes third and fourth clock lines through which the first and second clock CK and CKB are applied in addition to the first and second clock lines, the delay of the first and second clock signal CK and CKB sequentially applied to the first, second, . . . , last gate line to have high voltage level may be minimized, and the LCD device may provide enhanced display quality.

While the exemplary embodiments of the present invention and its advantages have been described in detail, it should be understood that various changes, substitutions and alterations can be made herein without departing from the spirit and scope of the invention as defined by appended claims.

What is claimed is:

1. A liquid crystal display device comprising:
a display part including i) a first substrate having a pixel, a gate line and a data line, the pixel having a switching device connected to the gate line and the data line, ii) a second substrate facing the first substrate, and iii) a liquid crystal layer interposed between the first and second substrates;
a data driver for providing the data line with image data, the data driver formed adjacent to the display part and coupled to the data line; and
a gate driver for driving the switching device, the gate driver including a shift register and a wiring part, the shift register having a plurality of stages cascade-connected each other, the shift register being divided into a first group and a second group and being formed adjacent to the display part, external signals being applied to each of the stages through the wiring part, and each of the driving stages outputting a driving signal for controlling the switching device through an output terminal to the gate line, wherein the wiring part has a plurality of clock lines through which clock signals are supplied.

2. A driver circuit for driving an active matrix driving display device, the driver circuit comprising:
a plurality of driving stages, each of the driving stages including an output terminal and a control terminal, the output terminal being coupled to the control terminal of a previous driving stage to be cascade-connected to each other; and
a dummy stage including a dummy output terminal and a dummy control terminal, the dummy output terminal being coupled to the control terminal of a last driving stage among the driving stages, and the dummy control terminal being coupled to the dummy output terminal.

3. The driver circuit of claim 2, wherein each of the driving stages outputs a driving signal for controlling a switching device through the output terminal, the switching device being arranged on the active matrix driving display device.

4. The driver circuit of claim 2, wherein the dummy output terminal comprises:
a pull-up part for providing the dummy output terminal with a turn-on voltage signal having a voltage level high enough to turn-on the switching device; and
a pull-down part for providing the dummy output terminal with a turn-off voltage signal having a voltage level enough to turn-off the switching device.

5. The driver circuit of claim 2, wherein the dummy control terminal further comprises:
a pull-up driver part for driving the pull-up part, the pull-up driver part being coupled to a first input node of the pull-up part, turning on the pull-up part in response to an input signal outputted from an input terminal of the dummy stage and turning off the pull-up part in response to the turn-on voltage signal outputted from the dummy control terminal after a second predetermined period; and
a pull-down driver part for driving the pull-down part, the pull-down driver part being coupled to a second input node of the pull-down part, turning off the pull-down part in response to the input signal outputted from the input terminal of the dummy stage and turning on the pull-down part in response to the turn-on voltage signal outputted from the dummy control terminal after a third predetermined period.

6. A liquid crystal display device comprising:
a display part including i) a first substrate having a plurality of gate lines connected to a switching device formed on a pixel, the pixel being arranged in a matrix shape, ii) a second substrate facing the first substrate, and iii) a liquid crystal layer interposed between the first and second substrates;
a gate driver for driving the switching device, the gate driver including i) a plurality of driving stages, each of the driving stages having an output terminal and a control terminal, the output terminal of a present driving stage being coupled to the control terminal of a previous driving stage to be cascade-connected to each other, and ii) a dummy stage including a dummy output terminal and a dummy control terminal, the dummy output terminal being coupled to the control terminal of a last driving stage among the driving stages, and the dummy control terminal being coupled to the dummy output terminal.

7. The liquid crystal display device of claim 6, wherein each of the driving stages outputs a driving signal for controlling a switching device through the output terminal, the switching device being arranged on the active matrix driving display device.

8. The liquid crystal display device of claim 6, wherein the dummy output terminal comprises:
a pull-up part for providing the dummy output terminal with a turn-on voltage signal having a voltage level high enough to turn-on the switching device; and
a pull-down part for providing the dummy output terminal with turn-off voltage signal having a voltage level enough to turn-off the switching device.

9. The liquid crystal display device of claim 6, wherein the dummy output terminal further comprises:
a pull-up driver part for driving the pull-up part, the pull-up driver part being coupled to a first input node of the pull-up part, turning on the pull-up part in response to an input signal outputted from an input terminal of the dummy stage and turning off the pull-up part in response to the turn-on voltage signal outputted from the dummy control terminal after a second predetermined period; and
a pull-down driver part for driving the pull-down part, the pull-down driver part being coupled to a second input node of the pull-down part, turning off the pull-down part in response to the input signal outputted from the input terminal of the dummy stage and turning on the pull-down part in response to the turn-on voltage signal outputted from the dummy control terminal after a third predetermined period.

* * * * *